United States Patent
Kickelbick et al.

(10) Patent No.: US 12,404,372 B2
(45) Date of Patent: Sep. 2, 2025

(54) PRECURSOR FOR PRODUCING A POLYSILOXANE, POLYSILOXANE, POLYSILOXANE RESIN, METHOD OF PRODUCING A POLYSILOXANE, METHOD OF PRODUCING A POLYSILOXANE RESIN, AND OPTOELECTRONIC COMPONENT

(71) Applicant: ams-OSRAM International GmbH, Regensburg (DE)

(72) Inventors: Guido Kickelbick, St. Ingbert (DE); Dennis Meier, St. Wendel (DE)

(73) Assignee: ams-OSRAM International GmbH, Regensburg (DE)

( * ) Notice: Subject to any disclaimer, the term of this patent is extended or adjusted under 35 U.S.C. 154(b) by 485 days.

(21) Appl. No.: 18/015,442

(22) PCT Filed: Jul. 2, 2021

(86) PCT No.: PCT/EP2021/068353
§ 371 (c)(1),
(2) Date: Jan. 10, 2023

(87) PCT Pub. No.: WO2022/008377
PCT Pub. Date: Jan. 13, 2022

(65) Prior Publication Data
US 2023/0287182 A1   Sep. 14, 2023

(30) Foreign Application Priority Data
Jul. 10, 2020  (DE) .......................... 102020118247.3

(51) Int. Cl.
C08G 77/06    (2006.01)
C08G 77/18    (2006.01)

(52) U.S. Cl.
CPC ............. C08G 77/06 (2013.01); C08G 77/18 (2013.01)

(58) Field of Classification Search
CPC ................. C08G 77/06; C08G 77/18
See application file for complete search history.

(56) References Cited

U.S. PATENT DOCUMENTS

2004/0236057 A1   11/2004   Chevalier et al.
2006/0159937 A1   7/2006    Miyoshi et al.
(Continued)

FOREIGN PATENT DOCUMENTS

| CN | 104788488 A | 7/2015 |
|---|---|---|
| CN | 106188125 A | 12/2016 |

(Continued)

OTHER PUBLICATIONS

Decision on Rejection dated Sep. 11, 2023, of counterpart Chinese Patent Application No. 202180049176.4, along with a Summary of the Decision on Rejection in English.
(Continued)

Primary Examiner — John E Uselding
(74) Attorney, Agent, or Firm — DLA Piper LLP (US)

(57) ABSTRACT

A polysiloxane includes first, second and third repeating units linked together in any order, wherein the first repeating units are based on first precursors selected from divinyldialkoxysilanes, substituted and unsubstituted vinyldialkoxysilanes, and monosubstituted and unsubstituted dialkoxysilanes, the substituted vinyldialkoxysilanes and the monosubstituted dialkoxysilanes each include substituents independently of one another, selected from substituted and unsubstituted alkyl groups and substituted and unsubstituted aryl groups, the second repeating units are based on second precursors selected from dialkoxysilanes including a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted (Continued)

dialkoxysilanes and substituted disilanols each including two substituents independently selected from substituted and unsubstituted alkyl groups and substituted and unsubstituted aryl groups.

11 Claims, 17 Drawing Sheets

(56) References Cited

U.S. PATENT DOCUMENTS

| | | | |
|---|---|---|---|
| 2009/0090413 | A1 | 4/2009 | Katsoulis et al. |
| 2015/0144987 | A1 | 5/2015 | Hamamoto et al. |
| 2015/0344636 | A1 | 12/2015 | Iimura et al. |
| 2019/0256533 | A1 | 8/2019 | Shuto et al. |

FOREIGN PATENT DOCUMENTS

| | | | |
|---|---|---|---|
| JP | 2000-235103 | A | 8/2000 |
| JP | 2003-129026 | A | 5/2003 |
| JP | 2010-007057 | A | 1/2010 |
| JP | 2010-180323 | A | 8/2010 |
| JP | 2012-251116 | A | 12/2012 |
| JP | 2013-053186 | A | 3/2013 |
| JP | 2015-127803 | A | 7/2015 |
| JP | 2018-111783 | A | 7/2018 |
| KR | 20060084808 | A | 7/2006 |
| KR | 20080112381 | A | 12/2008 |
| WO | 2014/104390 | A2 | 7/2014 |
| WO | 2014104388 | A2 | 7/2014 |
| WO | 2017/056913 | A1 | 4/2017 |
| WO | 2018/050514 | A1 | 3/2018 |

OTHER PUBLICATIONS

Office Action dated Sep. 11, 2024, of counterpart Korean Patent Application No. 10-2023-7001619 along with an English translation.

Shin-ichi Kondo et al., "Anion Recognition by a Silanediol-Based Receptor," Organic Letters, 2006, vol. 8, No. 20, pp. 4621-4624.

Joon-Soo Kim et al., "High performance encapsulant for light-emitting diodes (LEDs) by a sol-gel derived hydrogen siloxane hybrid," Journal of Materials Chemistry, 2012, vol. 22, pp. 7954-7960.

Shin-ichi Kondo et al., "Ratiometric Fluorescence Detection of Anions by Silanediol-based Receptors Bearing Anthryl and Pyenyl Groups," Organic Letters, 2013, vol. 15, No. 3, pp. 520-523.

David W. Mosley et al., "High Refractive Index Thermally Stable Phenoxyphenyl and Phenylthiophenyl Silicones for Light-Emitting Diode Applications," Journal of Applied Polymer Science, 2014, pp. 39824-1-39824-10.

Nils Steinbrück et al., "Effect of polysiloxane encapsulation material compositions on emission behaviour and stabilities of perylene dyes," RSC Advances, 2018, vol. 8, pp. 18128-18138.

Nils Steinbrück et al., "Platinum free thermally curable siloxanes for optoelectronic application—synthesis and properties," RSC Advances, 2019, vol. 9, pp. 2205-2216.

International Search Report dated Nov. 3, 2021 in counterpart International Application No. PCT/EP2021/068353.

Written Opinion dated Nov. 3, 2021 in counterpart International Application No. PCT/EP2021/068353.

Decision to Grant a Patent dated Jul. 2, 2024, of counterpart Japanese Patent Application No. 2022-579766, along with an English translation.

Examination Report dated Nov. 4, 2024, of counterpart German Patent Application No. 11 2021 003 697.1 with an English translation.

First Office Action dated Jul. 17, 2023, of counterpart Chinese Patent Application No. 202180049176.4, along with English translation.

Y. Hu et al, "Density and refractive Index of binary solutions of dimethyldimethoxysilane with three kinds of alkoxysilane compounds," Journal of Nanjing Tech University, Natural Science Edition, vol. 39, No. 06, pp. 82-90 and 117, Nov. 30, 2017, Abstract in English only.

Y. Gao et al, "2,5-Dimethyl-3,4-diphenyl-phenyl polysiloxane as stationary phase for capillary gas chromatography," Chemical Reagents, vol. 34, No. 2, pp. 143-146, Feb. 15, 2012, Abstract in English only.

Y. Lei et al., "Preparation and properties of methyl naphthyl dicholosilane-diphenyldichlorosilane copolymer," China Elastomerics, vol. 13, No. 6, pp. 9-12, Dec. 25, 2003, Abstract in English only.

Notice of Allowance dated Mar. 27, 2025, from counterpart Korean Patent Application No. 10-2023-7001619.

Notice of Reasons for Rejection dated Mar. 12, 2024, of counterpart Japanese Patent Application No. 2022-579766, along with an English machine translation.

FIG 2
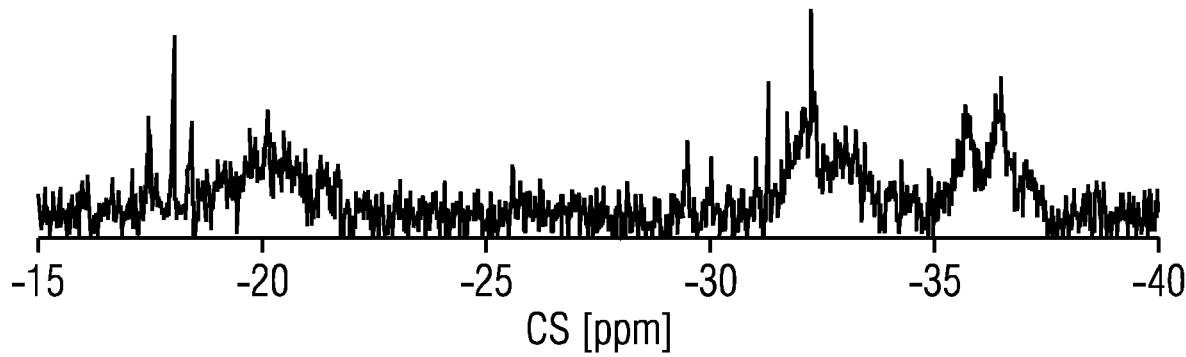
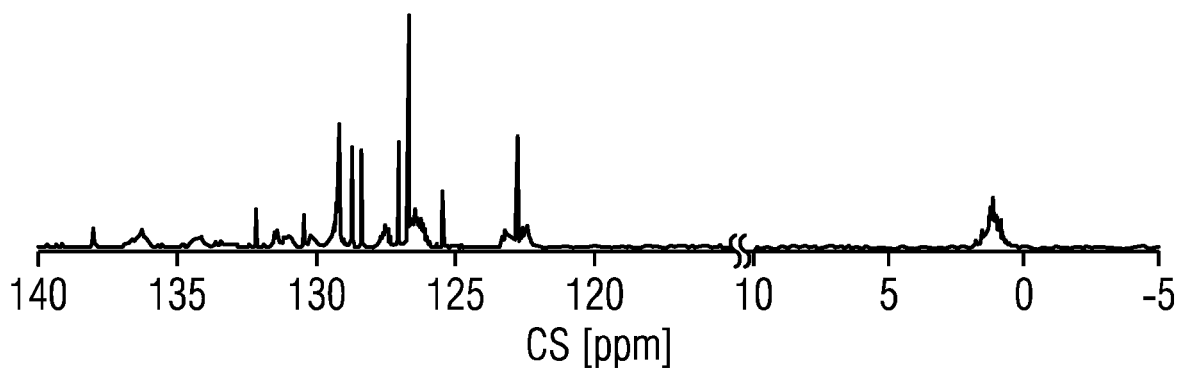
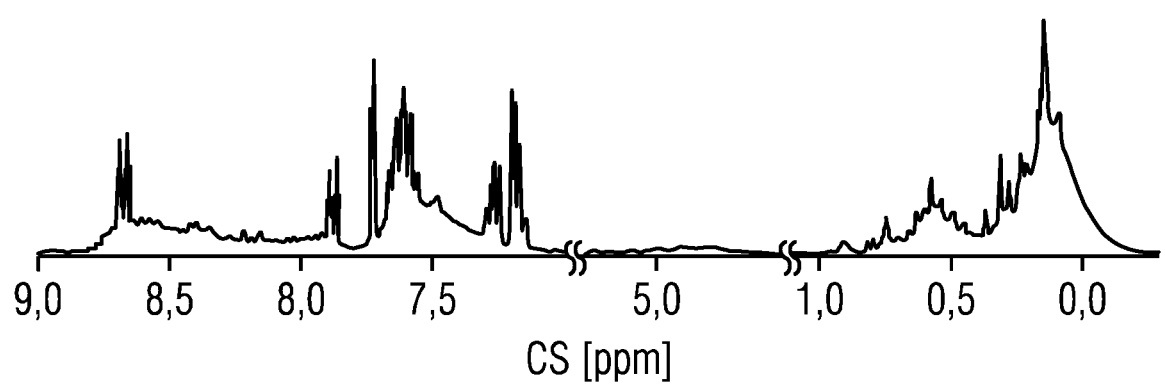

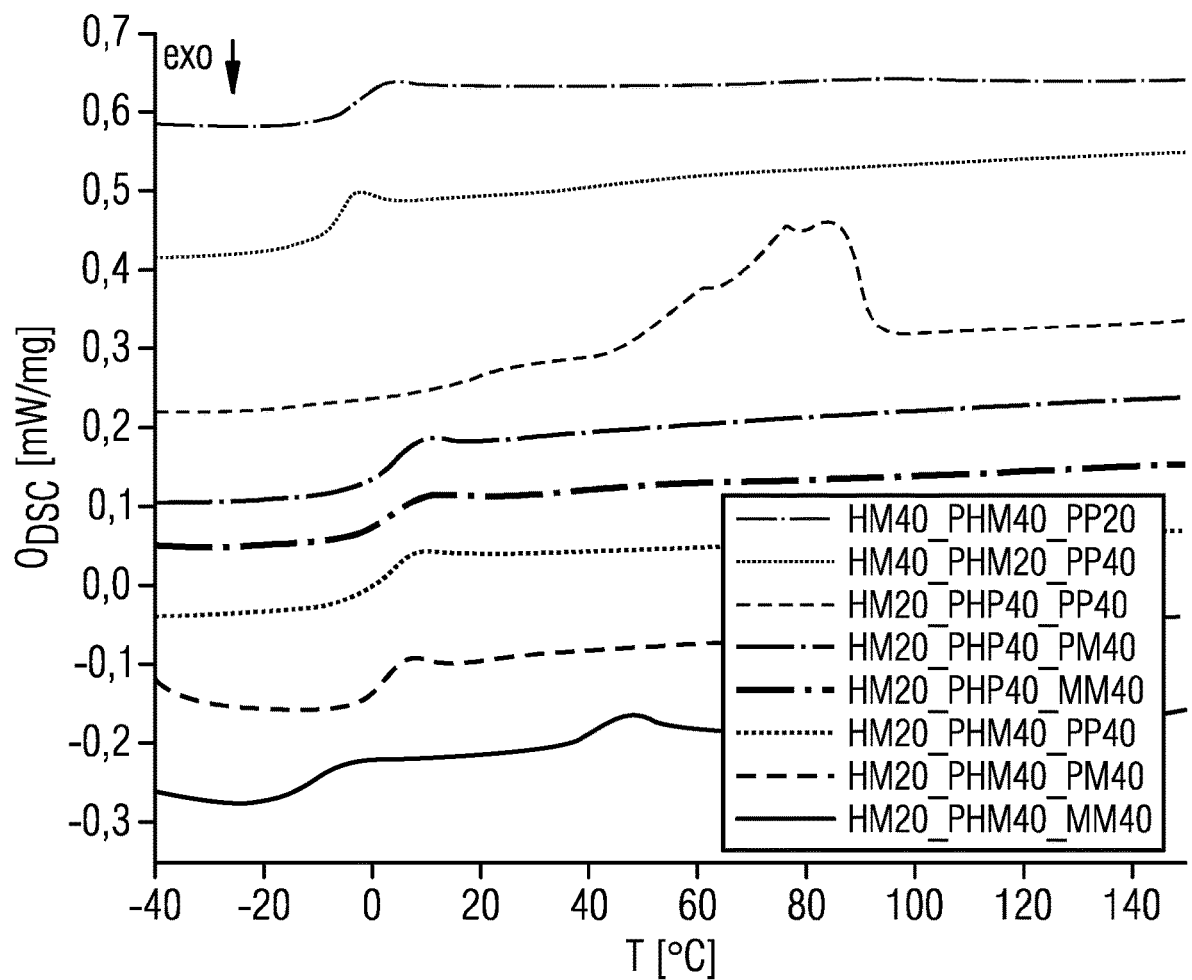

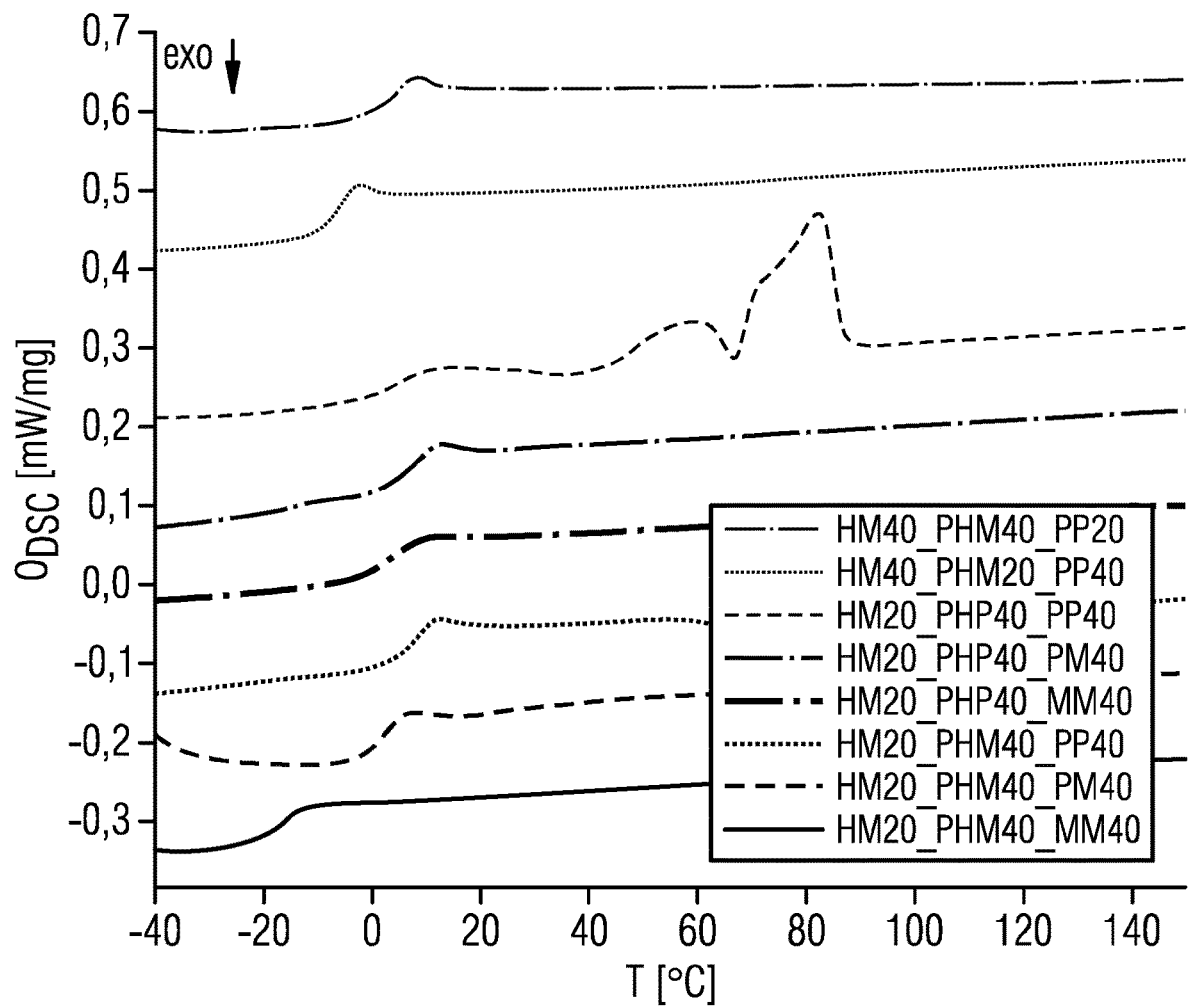

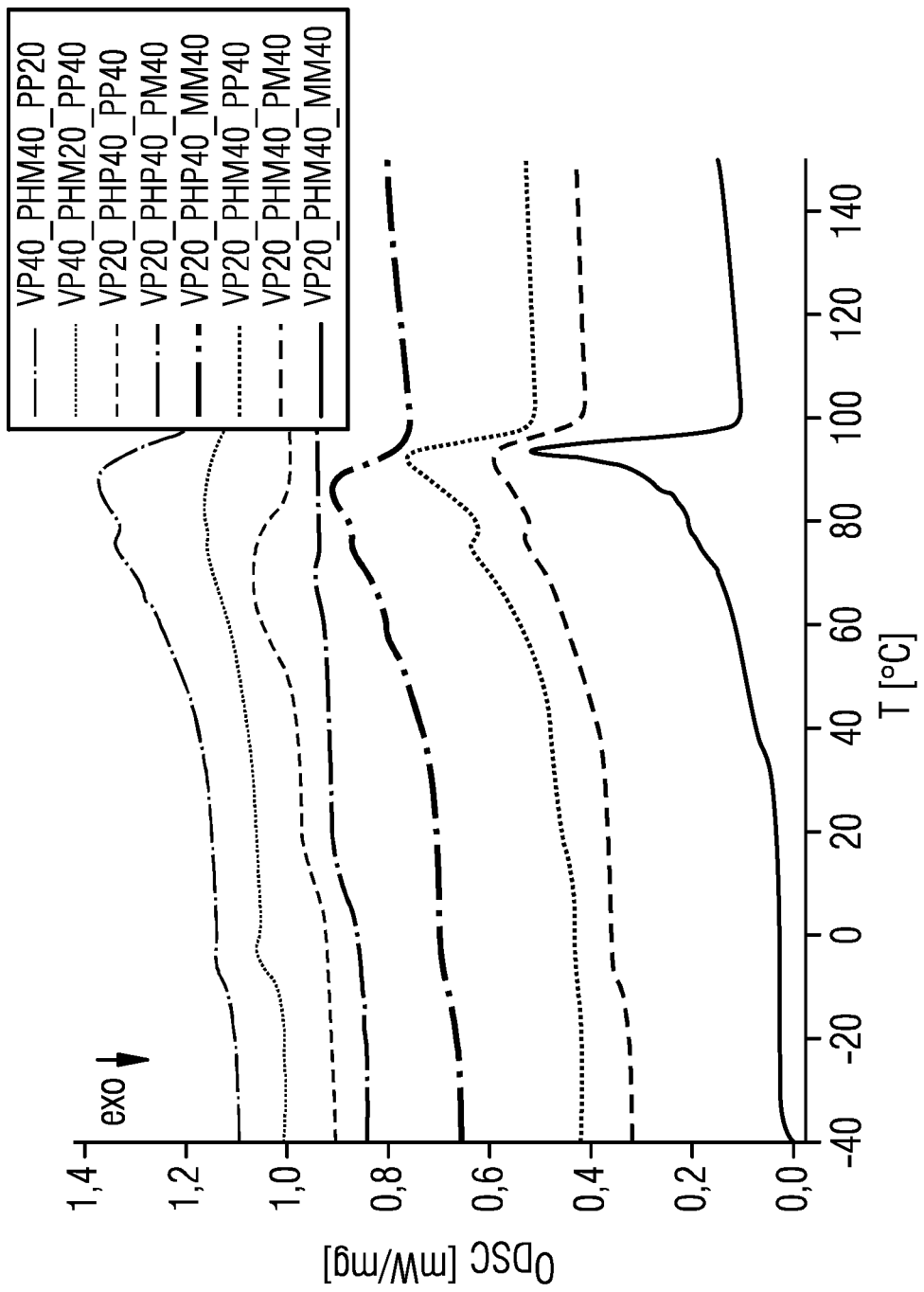

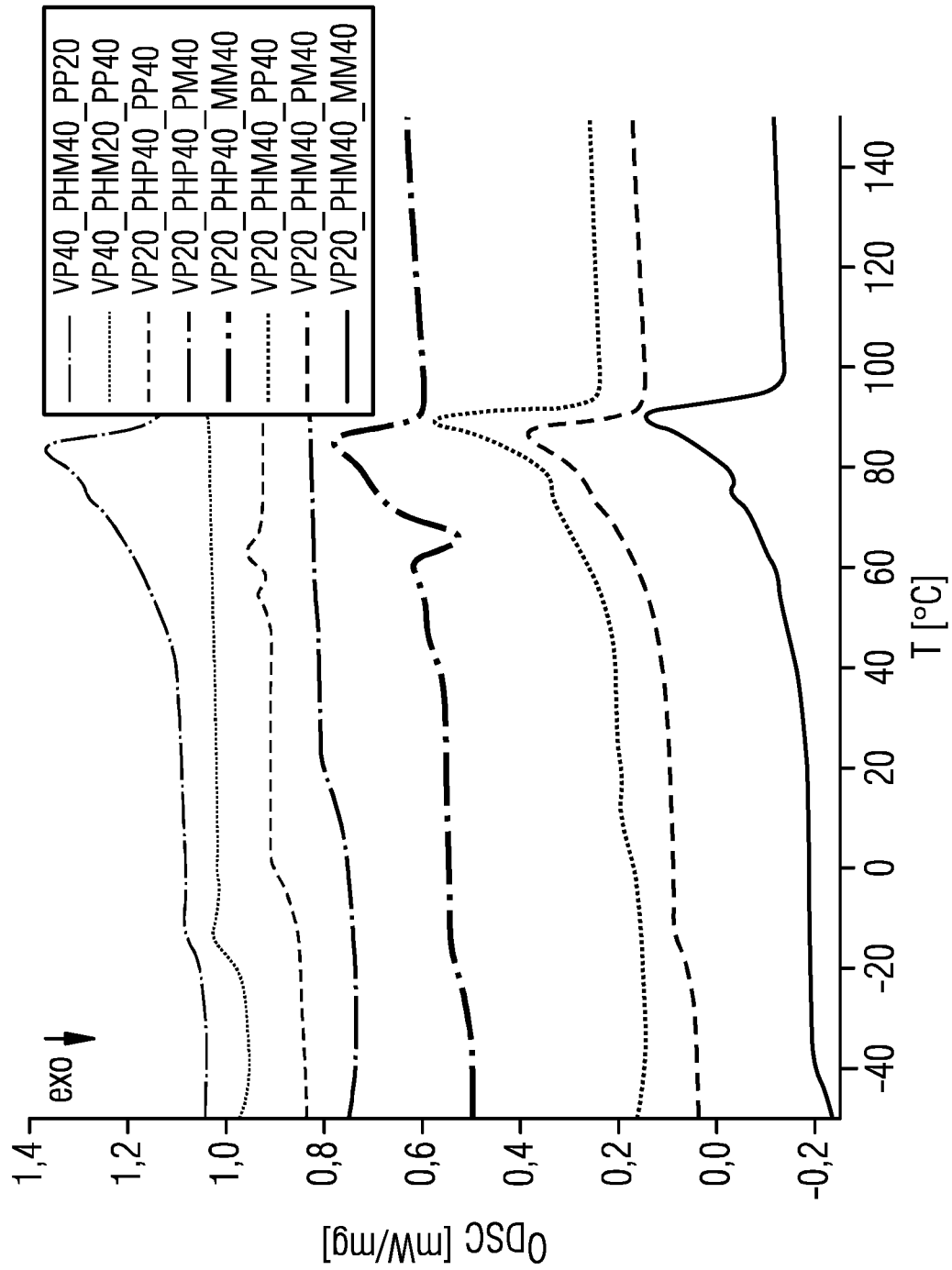

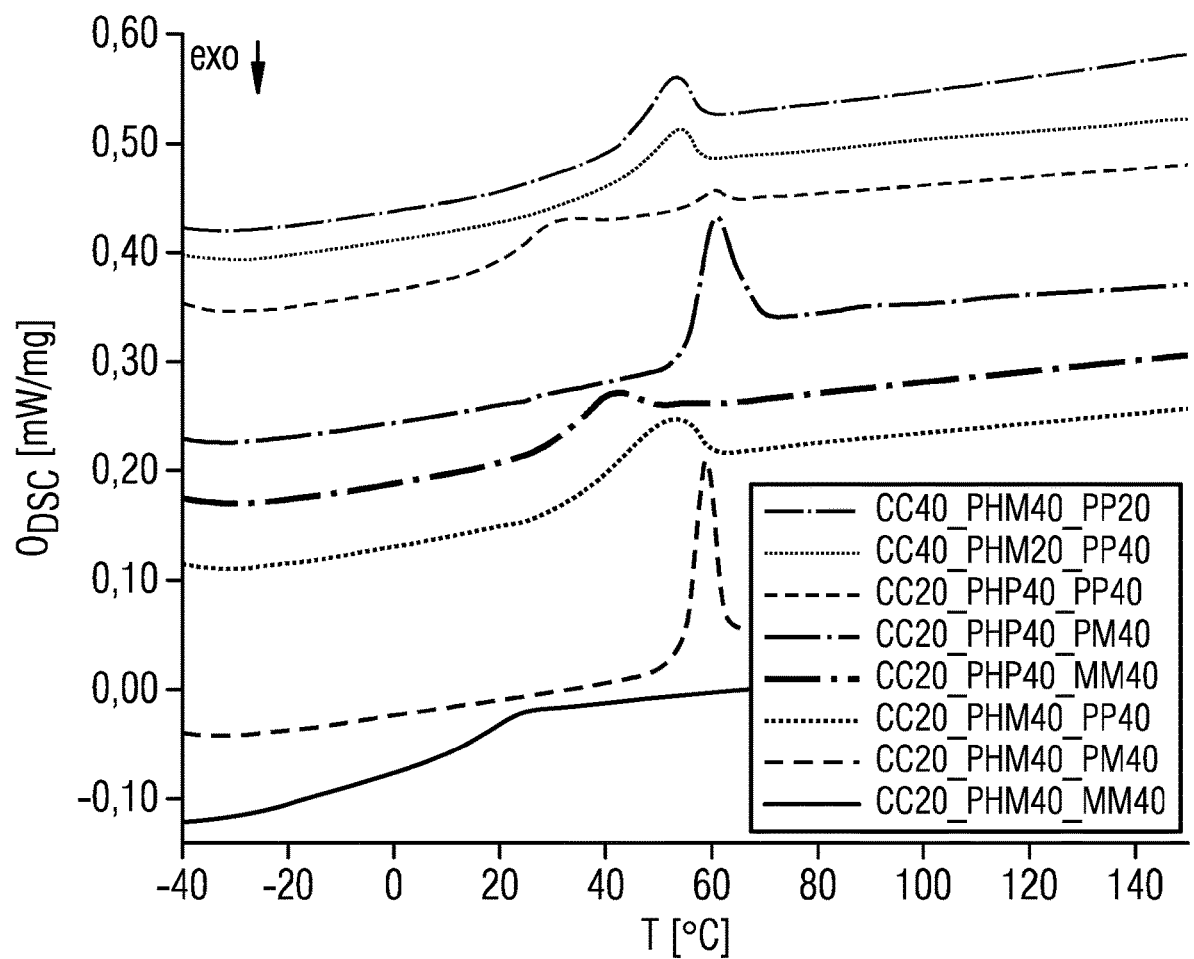

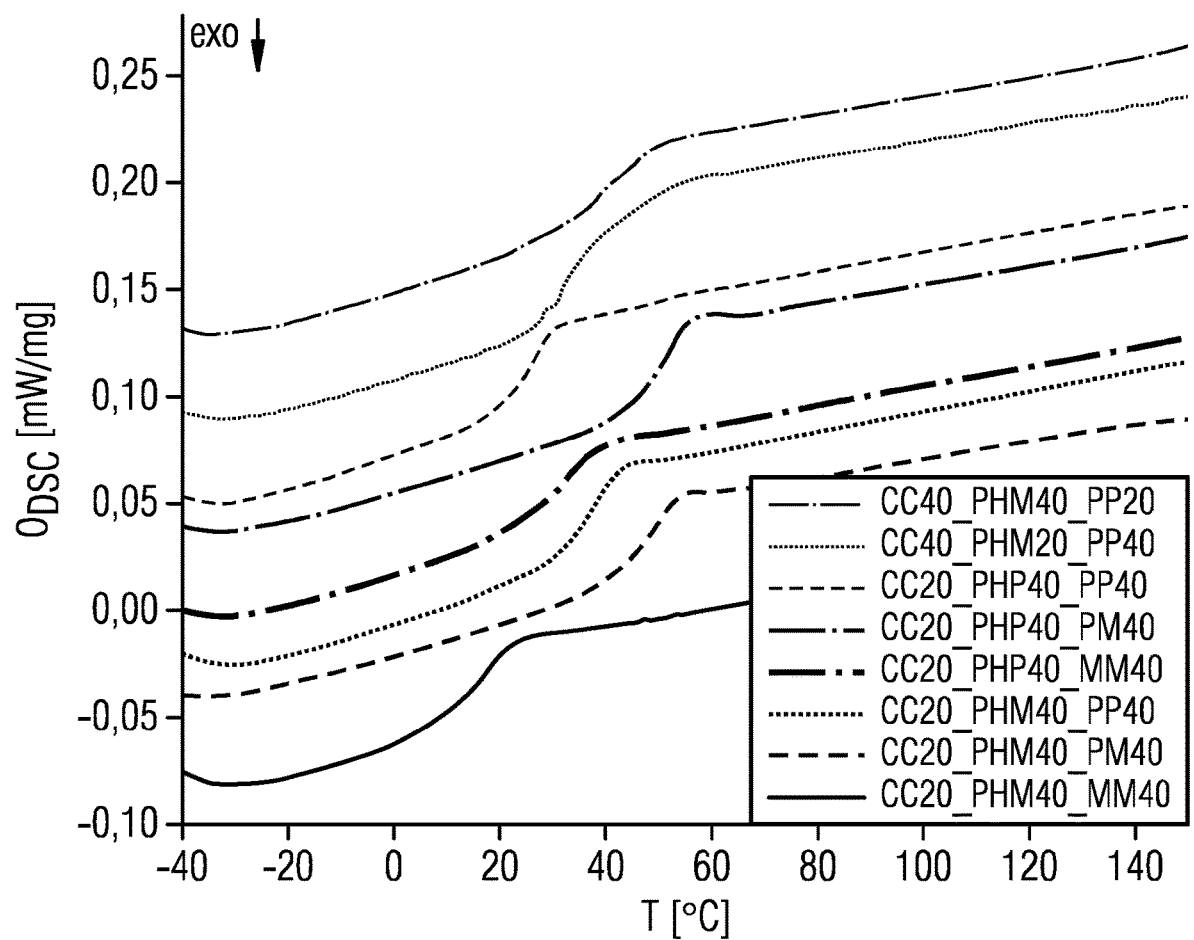

FIG 11

| MM40 | CC20_PHM40_ PM40 | CC20_PHM40_ PP40 | MM40 | CC20_PHP40_ PM40 | CC20_PHP40_ PP40 | CCxx_PHMxx_PPxx 20-40-40 40-20-40 | CCxx_PHMxx_PPxx 40-40-20 |

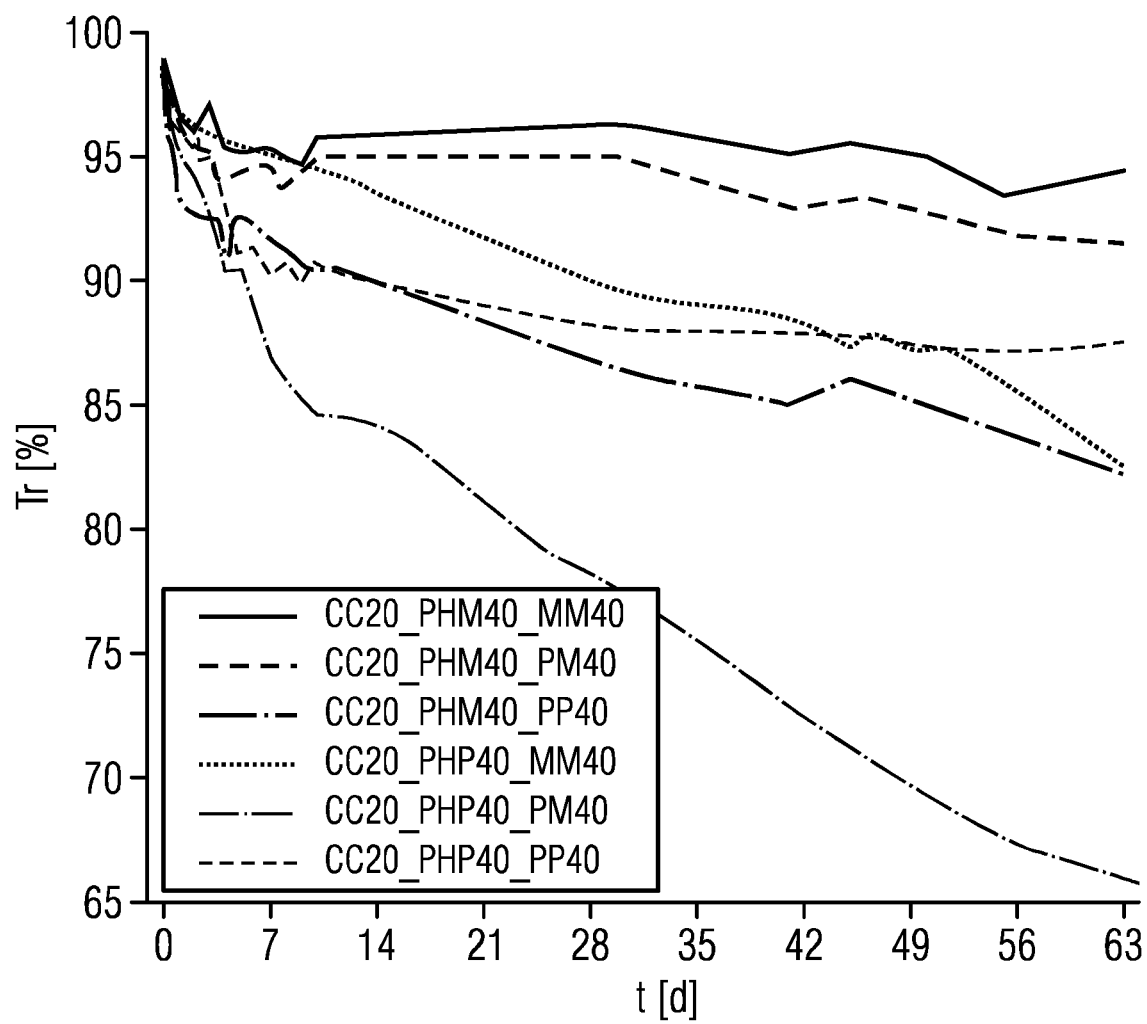

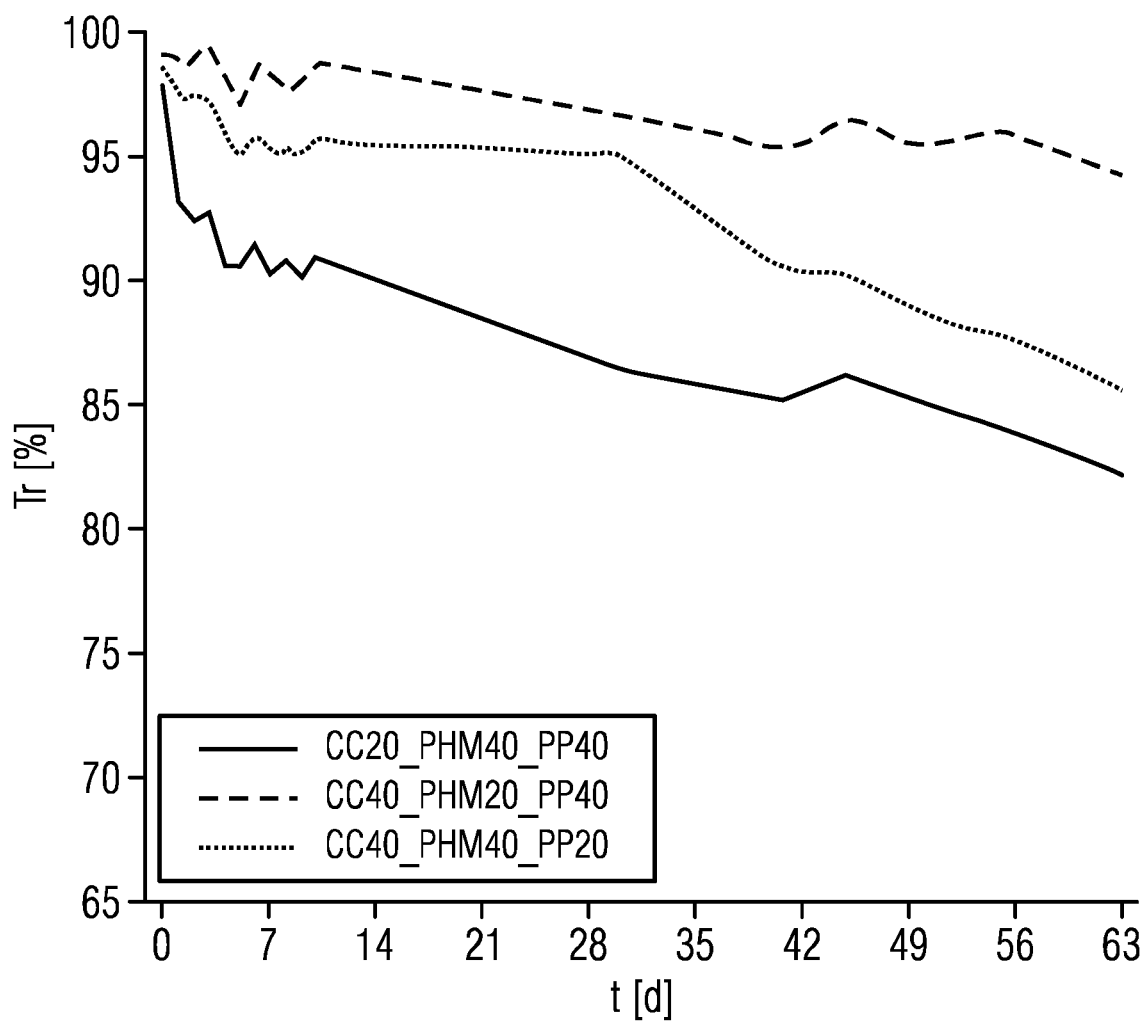

PRECURSOR FOR PRODUCING A POLYSILOXANE, POLYSILOXANE, POLYSILOXANE RESIN, METHOD OF PRODUCING A POLYSILOXANE, METHOD OF PRODUCING A POLYSILOXANE RESIN, AND OPTOELECTRONIC COMPONENT

TECHNICAL FIELD

This disclosure relates to a precursor for producing a polysiloxane, a polysiloxane, a polysiloxane resin, a method of producing a polysiloxane, a method of producing a polysiloxane resin, and an optoelectronic component.

BACKGROUND

There is a need to provide a precursor for producing a polysiloxane with improved properties, a polysiloxane with improved properties, a polysiloxane resin with improved properties, a method of producing a polysiloxane with improved properties, a method of producing a polysiloxane resin with improved properties, and an optoelectronic component with improved properties.

SUMMARY

We provide a polysiloxane including first, second and third repeating units linked together in any order, wherein the first repeating units are based on first precursors selected from divinyldialkoxysilanes, substituted and unsubstituted vinyldialkoxysilanes, and monosubstituted and unsubstituted dialkoxysilanes, the substituted vinyldialkoxysilanes and the monosubstituted dialkoxysilanes each include substituents independently of one another, selected from substituted and unsubstituted alkyl groups and substituted and unsubstituted aryl groups, the second repeating units are based on second precursors selected from dialkoxysilanes including a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each including two substituents independently selected from substituted and unsubstituted alkyl groups and substituted and unsubstituted aryl groups.

We also provide a polysiloxane resin including linked together first and second polysiloxanes, wherein the first and second polysiloxanes each include first, second and third repeating units linked together in any order, the second repeating units are based on second precursors selected from dialkoxysilanes including a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each including two substituents independently selected from substituted and unsubstituted alkyl groups and substituted and unsubstituted aryl groups, the first repeating units of the first polysiloxanes are based on first precursors selected from divinyldialkoxysilanes and substituted and unsubstituted vinyldialkoxysilanes, and wherein the first repeating units of the second polysiloxanes are based on first precursors selected from monosubstituted and unsubstituted dialkoxysilanes, wherein the substituted vinyldialkoxysilanes and the monosubstituted dialkoxysilanes each independently include substituents selected from substituted and unsubstituted alkyl groups and substituted and unsubstituted aryl groups.

We further provide an optoelectronic component configured to emit UV and/or visible radiation including at least one component including a polysiloxane resin including linked together first and second polysiloxanes, wherein the first and second polysiloxanes each include first, second and third repeating units linked together in any order, the second repeating units are based on second precursors selected from dialkoxysilanes including a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each including two substituents independently selected from substituted and unsubstituted alkyl groups and substituted and unsubstituted aryl groups, the first repeating units of the first polysiloxanes are based on first precursors selected from divinyldialkoxysilanes and substituted and unsubstituted vinyldialkoxysilanes, and the first repeating units of the second polysiloxanes are based on first precursors selected from monosubstituted and unsubstituted dialkoxysilanes, the substituted vinyldialkoxysilanes and the monosubstituted dialkoxysilanes each independently include substituents selected from substituted and unsubstituted alkyl groups and substituted and unsubstituted aryl groups.

BRIEF DESCRIPTION OF THE DRAWINGS

FIG. 2 shows $^{29}$Si, $^{13}$C and $^{1}$H NMR spectra of examples of polysiloxanes.

FIGS. 5A to 5D show DSC curves of examples of polysiloxanes.

FIGS. 10A and 10B show DSC curves of polysiloxane resins according to examples.

FIG. 11 shows transmittances of polysiloxane resins according to examples.

FIGS. 12A and 12B show transmittances of polysiloxane resins according to examples.

Figure 1:
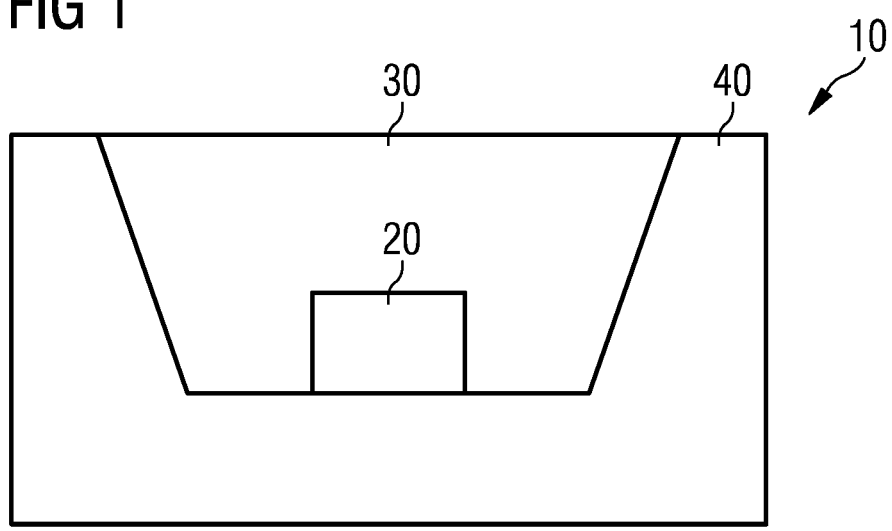
FIG. 1 shows a schematic side view in cross-section of an optoelectronic component according to one example.

LIST OF REFERENCE SIGNS 10 optoelectronic component
20 semiconductor chip
30 encapsulation
40 housing

DETAILED DESCRIPTION

We provide a precursor for producing a polysiloxane. As a precursor is understood here and in the following a precursor material, in particular a monomer, from which a polysiloxane can be prepared. Thereby, the precursor can be used alone or together with other precursor materials for producing the polysiloxane. For example, if a polysiloxane is produced from a type of precursor, the polysiloxane consists of repeating units each based on the precursor. That is, each repeating unit comprises substantially the structure of the precursor, wherein the repeating unit comprises a covalent bond with the adjacent repeating unit due to polymerization. It is also possible for a polysiloxane to be produced from different precursors such that the polysiloxane has different repeating units, which are each covalently linked to each other.

The precursor may comprise a dialkoxysilane. As a dialkoxysilane is understood here and in the following a compound comprising a silicon atom comprising two alkoxy groups as substituents. Thereby, the silicon is bonded to the oxygen atom. For example, a dialkoxysilane is selected from dimethoxysilane, diethoxysilane and diisopropoxysilane. In particular, the dialkoxysilane may be dimethoxysilane. Due to its valence, the silicon in the dialkoxysilane has two substituents in addition to the alkoxy groups.

The dialkoxysilane may comprise a substituent selected from substituted and unsubstituted alkyl groups and substituted and unsubstituted aryl groups, and a substituent selected from substituted and unsubstituted polycyclic aromatic hydrocarbon groups. Thus, the dialkoxysilane comprises two substituents in addition to the two alkoxy groups. Of these, one substituent is either a substituted or unsubstituted alkyl group or a substituted or unsubstituted aryl group. The other substituent is a substituted or unsubstituted polycyclic aromatic hydrocarbon group.

A precursor for producing a polysiloxane may comprise a dialkoxysilane comprising a substituent selected from substituted and unsubstituted alkyl groups and substituted and unsubstituted aryl groups, and a substituent selected from substituted and unsubstituted polycyclic aromatic hydrocarbon groups.

Polysiloxanes containing the precursors mentioned above are particularly suitable as encapsulation materials for optoelectronic components, especially optoelectronic radiation-emitting components, for example, light-emitting diodes (LEDs). On the one hand, they exhibit high optical transparency in the visible range and, on the other hand, high chemical as well as thermal stability. Due to the presence of polycyclic aromatic hydrocarbon groups on the polysiloxane backbone, the refractive index of such polysiloxanes is increased compared to conventional polysiloxanes. Furthermore, the refractive index can be tuned by suitable selection of the substituents, which means that the polysiloxane can be precisely matched to the intended application.

Known solutions for increasing the refractive index of encapsulation materials are, for example, embedding nanoparticles with a high refractive index such as zirconium oxide or titanium oxide, in a conventional polysiloxane matrix. However, this can lead to a reduction in the transparency of the encapsulation material and, in turn, to a low light output. Also, discoloration of the encapsulation material cannot be ruled out, which leads to a distorted color impression of the LED. In addition, introduction of further components into a polymer matrix also causes a change in the viscosity of the material and thus more difficult processing or the need to adapt the processing methods.

Another known solution for increasing the refractive index is to change the substitution pattern on the silicon atoms of polysiloxanes, which are used as encapsulation materials. Until now, for example, systems have been used that contain highly polarizable impurity atoms such as sulfur. However, these impurity atoms cause problems in LED applications due to interactions with the materials used in the LED, or lead to discoloration of the encapsulation material and/or to reduced transparency.

In contrast, the polycyclic aromatic hydrocarbon groups in the precursor have no impurity atoms or impurity atom-substituted radicals and at the same time exhibit a high refractive index. Thus, by using the precursors described above, polysiloxane chains with purely organic substituents can be prepared that induce a high refractive index into the system. Thus, the refractive index of a material, for example, an encapsulation material comprising a polysiloxane containing the precursors described herein can be matched to the refractive index of a light-emitting semiconductor chip, for example, a GaN chip.

An LED chip emitting blue light with a wavelength of 450 nm, for example, has an average refractive index of 2.5 to 4.0. Total reflection of photons can now occur at the interface with a conventional encapsulation material since conventional encapsulation materials have a significantly lower refractive index. This leads to a reduction in the efficiency of LEDs.

In contrast, polysiloxanes containing or produced from the precursors described have an increased refractive index compared to conventional encapsulation materials and thus allow more light to be coupled out in the LED application. Depending on the choice of substituents on the precursor, a tunable refractive index can be set. The resulting polysiloxanes also exhibit high optical transmittance and high stability, especially thermal stability. The disadvantages mentioned above for conventional polysiloxanes can be avoided.

The unsubstituted or substituted polycyclic aromatic hydrocarbon groups may be free of impurity atoms. As impurity atoms are understood here and in the following in particular atoms which are not carbon or hydrogen, for example, sulfur.

The substituted or unsubstituted alkyl group may comprise a methyl group or the substituted or unsubstituted aryl group is selected from a phenyl group and polycyclic aromatic hydrocarbon groups. Thus, in addition to the two alkoxy groups, the dialkoxysilane may contain a methyl group or a phenyl group or a polycyclic aromatic hydrocarbon group as further substituents.

The polycyclic aromatic hydrocarbon groups may be selected from phenanthrene, naphthalene, anthracene and pyrene.

The precursor can thus have, for example, a structural formula selected from one of the following structural formulas (1) to (6), each of which is indicated with its short term. A dimethoxysilane is selected as the dialkoxysilane, a methyl group (formulas (1) to (3)) or a phenyl group (formulas (4) to (6)) as the substituent, and 1-naphthalene (formulas (1) and (4)), 2-naphthalene (formulas (2) and (5)) or 9-phenanthrene (formulas (3) and (6)) as the polycyclic aromatic hydrocarbon group.

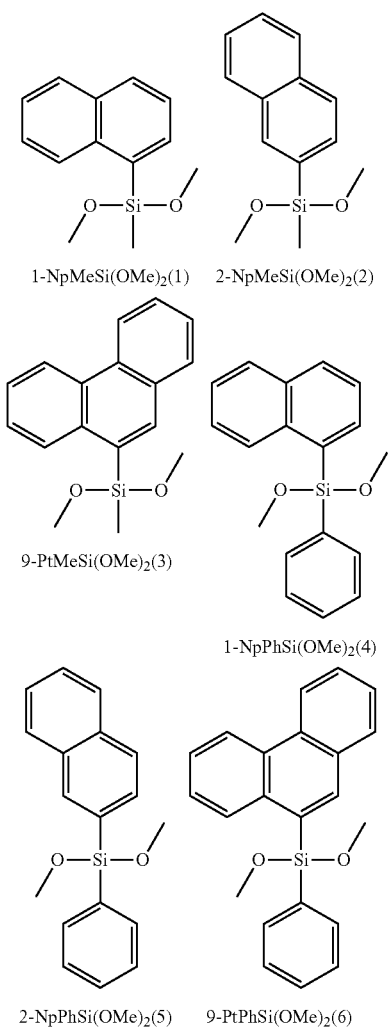

1-NpMeSi(OMe)₂(1)   2-NpMeSi(OMe)₂(2)

9-PtMeSi(OMe)₂(3)

1-NpPhSi(OMe)₂(4)

2-NpPhSi(OMe)₂(5)   9-PtPhSi(OMe)₂(6)

In particular, the precursor may have a structural formula selected from formulae (3) and (6). In the following, a precursor with structural formula (3) is also called PHM, and a precursor with structural formula (6) is also called PHP.

A polysiloxane comprises first, second and third repeating units linked together in any order. At least one of the first, second and third repeating units is thereby based on a precursor described herein. The precursor described herein is thus suitable and intended to produce a polysiloxane described herein. All properties and features of the precursor thus also apply to the polysiloxane and vice versa. In particular, the first, second and third repeating units are structurally different repeating units. In other words, the first, second and third repeating units have different substituents and/or substitution patterns.

"Any order" means that the first, second and third repeating units may be arranged alternately in different order, and two adjacent repeating units may be the same or different. "Linked together" means that a covalent bond is present between two repeating units, respectively.

The first repeating units may be based on first precursors selected from divinyldialkoxysilanes, substituted and unsubstituted vinyldialkoxysilanes, and monosubstituted and unsubstituted dialkoxysilanes.

The substituted vinyldialkoxysilanes and the monosubstituted dialkoxysilanes may independently have substituents selected from substituted and unsubstituted alkyl groups and substituted and unsubstituted aryl groups. Aryl groups may be selected from phenyl groups and polycyclic aromatic hydrocarbon groups. "Monosubstituted dialkoxysilane" means that, in addition to the two alkoxy groups, another substituent and a H atom are bonded to the Si. Thus, in the monosubstituted dialkoxysilane there is a Si—H bond (also a hydride group).

For example, the first precursors may be selected from vinylphenyldiethoxysilane (VP), methyldiethoxysilane (HM), vinylmethyldiethoxysilane, phenyldiethoxysilane, vinylphenyldimethoxysilane, methyldimethoxysilane, vinylmethyldimethoxysilane, and phenyldimethoxysilane. In particular, one of VP and HM may be selected as the first precursor.

"Based on precursors" means that the respective repeating unit corresponds to the respective precursor in its structure, except for the unit of the precursor intended for linkage, which has reacted in the repeating unit with the adjacent repeating unit and forms a covalent bond to the adjacent repeating unit.

Thus, the first precursors may have, for example, one of the following structural formulas:

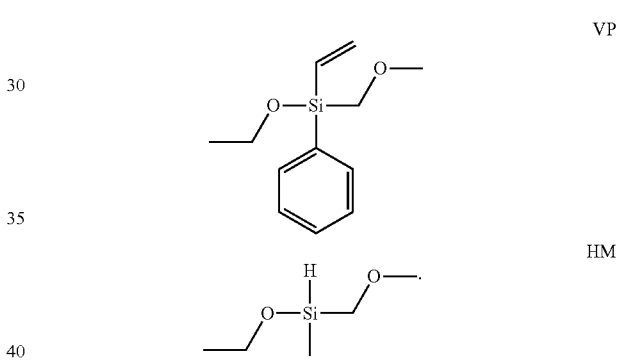

The second repeating units may be based on second precursors selected from dialkoxysilanes comprising a substituent selected from substituted and unsubstituted alkyl and substituted and unsubstituted aryl groups, and a substituent selected from substituted and unsubstituted polycyclic aromatic hydrocarbon groups.

The second repeating units may thus be based on second precursors, wherein the second precursors may correspond to the precursors described above. In particular, the second precursors may have any of the structural formulae (1) to (6). Preferably, the second precursors may be selected from PHM and PUP.

The third repeating units may be based on third precursors selected from substituted dialkoxysilanes and substituted disilanols, each comprising two substituents independently selected from substituted and unsubstituted alkyl groups and substituted and unsubstituted aryl groups. Aryl groups may be selected from phenyl groups and polycyclic aromatic hydrocarbon groups. For example, the third precursors may be selected from dimethyldimethoxysilane (MM), methyldimethoxyphenylsilane (PM) and diphenylsiloxanediol (PP).

Thus, the third precursors may have, for example, the following structural formulae:

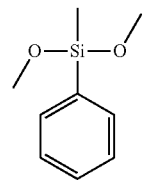

MM

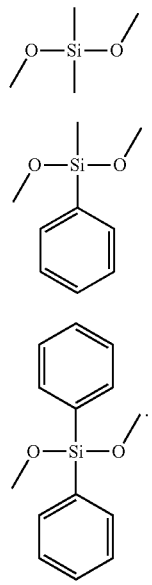

PM

PP

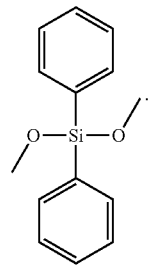

A polysiloxane may comprise first, second and third repeating units linked together in any order, wherein the first repeating units may be based on first precursors selected from divinyldialkoxysilanes, substituted and unsubstituted vinyldialkoxysilanes and monosubstituted and unsubstituted dialkoxysilanes, wherein the substituted vinyldialkoxysilanes and the monosubstituted dialkoxysilanes each independently may comprise substituents selected from substituted and unsubstituted alkyl groups and substituted and unsubstituted aryl groups, the second repeating units may be based on second precursors selected from dialkoxysilanes comprising a substituent selected from substituted and unsubstituted alkyl and substituted and unsubstituted aryl groups and a substituent selected from substituted and unsubstituted polycyclic aromatic hydrocarbon groups, and the third repeating units may be based on third precursors selected from substituted dialkoxysilanes and substituted disilanols each comprising two substituents independently selected from substituted and unsubstituted alkyl groups and substituted and unsubstituted aryl groups.

The combination of the first, second and third repeating units thus provides a polysiloxane comprising suitable properties for optical applications, for example, as an encapsulation material for LEDs. In particular, the polysiloxane comprises an increased refractive index with otherwise unchanged material properties compared to already known polysiloxanes. This can be used, for example, to further improve the efficiency of LEDs and increase their service life.

Si-vinyl groups are present in the first repeating units when a divinyldialkoxysilane or a vinyldialkoxysilane, for example, VP is selected as the first precursor, or Si—H groups when an unsubstituted or monosubstituted dialkoxysilane, for example, HM is selected as the first precursor. These groups ensure that the polysiloxane, when cured, can crosslink well and form a solid material. At least the second repeating units have extended aromatic side groups, which provide for the high refractive index of the polysiloxane. The third repeating units are based on relatively small third precursors, which have high mobility due to their small size and thus reduce the viscosity of the polysiloxane. This makes the polysiloxane easy to process.

The first precursors may be selected from vinylphenyldiethoxysilane (VP) and methyldiethoxysilane (HM).

The second precursors may be selected from 9-phenanthrenylmethyldimethoxysilane (9-PtMeSi(OMe)$_2$, PHM), 9-phenanthrenylphenylmethoxysilane (9-PtPhSi(OMe)$_2$, PUP), 1-naphthylmethyldimethoxysilane (1-NpMeSi(OMe)$_2$), 2-naphthylmethyldimethoxysilane (2-NpMeSi(OMe)$_2$), 1-naphthylphenyldimethoxysilane (1-NpPhSi(OMe)$_2$), and 2-naphthylpenyldimethoxysilane (2-NpPhSi(OMe)$_2$). These second precursors are already shown above by structural formulae (1) to (6). In particular, the second precursors may be selected from PHM and PUP.

The third precursors are selected from dimethyldimethoxysilane (MM), methyldimethoxyphenylsilane (PM), and diphenylsiloxanediol (PP).

The first, second, and third repeating units are present in the polysiloxane in a ratio that is 1:2:2. Thus, the first repeating units are present in the polysiloxane at a lower ratio compared to the second and third repeating units. Thus, fewer repeating units are used in the polysiloxane, which have a comparatively low refractive index and thus do not contribute to an increase in the refractive index in the final prepared polysiloxane. At the same time, however, the proportion of the first repeating unit is high enough to provide sufficient Si—H or Si-vinyl groups in the polysiloxane to lead to good crosslinking between the polymer chains when the polysiloxane is cured.

At the same time, the proportion of the second repeating unit should be as high as possible in the polysiloxane since this contributes significantly to increasing the overall refractive index due to its high refractive index. However, a proportion of more than 40 mol % can lead to a fragile material so the above proportion ratio should be largely maintained.

Depending on the desired viscosity of the polysiloxane, other ratios of the proportions of repeating units are also possible.

The first precursors may comprise vinylphenyldiethoxysilane (VP) and the polysiloxane comprises silicon atoms with vinyl substituents. Alternatively, the first precursors comprise methyldiethoxysilane (HM), whereby the polysiloxane comprises a Si—H group. Thus, with respect to the first repeating unit, and thus the repeating unit that contributes to good crosslinking during curing of the polysiloxane, the polysiloxane described herein can in principle have two different structures, one with Si—H groups and one with Si-vinyl groups.

The polysiloxane may comprise a refractive index that is 1.57 to 1.63. This means that the refractive index has a value between 1.57 and 1.63, inclusive, depending on the selected first, second and third precursors. Thus, the polysiloxane can be used particularly well as an encapsulation material for LEDs and can be adapted, for example, to the refractive index of the light-emitting semiconductor chip and/or the conversion material arranged thereon.

The polysiloxane may comprise an optical transmittance from 450 nm to 800 nm of 95% to 100%. This property also makes the polysiloxane particularly suitable for use as an encapsulation material in optoelectronic components since it exhibits high transmission of radiation in the visible range.

A polysiloxane resin comprises linked together first and second polysiloxanes. A "resin" means a material containing chain-like polymers comprising covalent bonds with one another at various linkage points. The linkages between the polymers thereby create a three-dimensional network. The polysiloxane resin has first and second polysiloxanes that are at least partially different from one another. The first and second polysiloxanes may be selected from the polysiloxanes described above, whereby all properties and features mentioned with respect to polysiloxane also apply to the polysiloxane resin, and vice versa.

The first and second polysiloxanes each comprise first, second and third repeating units linked together in any order. The second repeating units are based on second precursors selected from dialkoxysilanes comprising a substituent selected from substituted and unsubstituted alkyl and substituted and unsubstituted aryl groups and a substituent selected from substituted and unsubstituted polycyclic aromatic hydrocarbon groups. The third repeating units are based on third precursors selected from substituted dialkoxysilanes and substituted disilanols, each comprising two substituents independently selected from substituted and unsubstituted alkyl groups and substituted and unsubstituted aryl groups. The first repeating units of the first polysiloxanes are based on first precursors selected from divinyldialkoxysilanes and substituted and unsubstituted vinyldialkoxysilanes and the first repeating units of the second polysiloxanes are based on first precursors, selected from monosubstituted and unsubstituted dialkoxysilanes, wherein the substituted vinyldialkoxysilanes and the monosubstituted dialkoxysilanes each independently comprise substituents selected from substituted and unsubstituted alkyl groups and substituted and unsubstituted aryl groups. Thus, in the polysiloxane resin, first polysiloxanes are present which have Si-vinyl groups prior to linkage and second polysiloxanes which have Si—H groups in the unlinked state.

The second precursor of the first and second polysiloxanes may be a precursor described herein. In particular, the second precursor may be one of the precursors described with structural formulae (1) to (6). In particular, the second precursor may be PHM or PUP. The first polysiloxane may comprise, for example, VP as the first precursor. The second polysiloxane may comprise, for example, HM as the first precursor. First and second polysiloxanes may include as a third precursor, for example, MM, PM, or PP.

In addition to the above-mentioned advantageous properties of the precursors and the polysiloxanes, the polysiloxane resins prepared from the polysiloxane exhibit high hardness and significantly increased thermal stability compared to conventional polysiloxane resins, which can be attributed, for example, to reduced accessible decomposition processes.

Due to its composition of first and second polysiloxanes, the polysiloxane resin can also be referred to as a two-component system, which can be prepared, for example, by a hydrosilylation reaction between the Si-vinyl groups of the first polysiloxanes and the Si—H groups of the second polysiloxanes.

The polysiloxane resin has the additional property that particles, for example, dye particles can be dissolved therein. This means that the polysiloxane resin can additionally comprise a radiation-converting function, for example, when it is used as an encapsulation material for an LED. In addition, the polysiloxane resin comprises reduced permeability to oxygen and water, which is also advantageous for use as an encapsulation material.

The first and second polysiloxanes may be present in the polysiloxane resin in a ratio to each other selected from 2:1 to 1:2. In particular, the ratio may be 1:1. Thus, a well-crosslinked resin is present, which accordingly exhibits a high hardness.

A method of producing a polysiloxane is further disclosed. In particular, the method can be used to produce a polysiloxane described herein. Thus, all features and properties disclosed with respect to the polysiloxane also apply to the method and vice versa.

In the method of producing a polysiloxane, a first precursor, a second precursor, and a third precursor are mixed and linked together. According to one example, the first precursor is selected from divinyldialkoxysilanes, substituted and unsubstituted vinyldialkoxysilanes, and monosubstituted and unsubstituted dialkoxysilanes, wherein the substituted vinyldialkoxysilanes and the monosubstituted dialkoxysilanes each independently comprise substituents selected from substituted and unsubstituted alkyl groups and substituted and unsubstituted aryl groups, the second precursor is selected from dialkoxysilanes comprising a substituent selected from substituted and unsubstituted alkyl and substituted and unsubstituted aryl groups, and a substituent selected from substituted and unsubstituted polycyclic aromatic hydrocarbon groups, and the third precursor is selected from substituted dialkoxysilanes and substituted disilanols each comprising two substituents independently selected from substituted and unsubstituted alkyl groups and substituted and unsubstituted aryl groups. Thus, the second precursor is a precursor described herein. In particular, the second precursor may be one of the precursors described by structural formulae (1) to (6). In particular, the second precursor may be PHM or PUP. In particular, the first precursor may be VP or HM. The third precursor may be, for example, MM, PM or PP.

First, second and third precursors may be mixed in a ratio of 1:2:2. In other words, one equivalent of the first precursor, two equivalents of the second precursor, and two equivalents of the third precursor may be mixed together. Depending on the selection of the first, second and third precursors, solvents such as distilled water or an alcohol, in particular methanol, are optionally added. Furthermore, tetrahydrofuran or ethyl ether can also be used as solvents. Furthermore, concentrated hydrochloric acid or tetra-n-butylammonium hydroxide can be added. Depending on the desired property, for example, viscosity of the polysiloxane, other mixing ratios can also be selected.

The linkage may be carried out by hydrolysis and condensation. For this purpose, the mixture of first, second and third precursor may be stirred, for example, at an elevated temperature. For example, the mixture is heated to a temperature of 80° C. to 120° C. In particular, stirring at an elevated temperature occurs for a time of at least one hour. Preferably, the stirring occurs for a time of from one hour to 5 hours. For example, the stirring is carried out for 4 h. Thereby, it is possible that the mixture is first stirred for a first time at a first temperature and for a second time at a second temperature.

This method can be used to produce a first polysiloxane as described above, as well as a second polysiloxane as described above. When divinyldialkoxysilane, substituted or unsubstituted vinyldialkoxysilane, for example, VP is selected as the first precursor, a first polysiloxane is produced, when monosubstituted or unsubstituted dialkoxysilane, for example, HM is selected, a second polysiloxane is produced.

We also provide a method of producing a polysiloxane resin. The polysiloxane resin may be a polysiloxane resin described above. Thus, all features and properties disclosed in connection with the polysiloxane resin also apply to the method and vice versa.

In the method of producing a polysiloxane resin, according to one example, a first polysiloxane and a second polysiloxane are mixed and cured. In this regard, the first polysiloxane and the second polysiloxane each comprise first, second, and third repeating units that are linked together in any order. The second repeating units may be based on second precursors selected from dialkoxysilanes comprising a substituent selected from substituted and unsubstituted alkyl and substituted and unsubstituted aryl groups and a substituent selected from substituted and unsubstituted polycyclic aromatic hydrocarbon groups, and the third repeating units may be based on third precursors selected from substituted dialkoxysilanes and substituted disilanols each may comprise two substituents independently selected from substituted and unsubstituted alkyl groups and substituted and unsubstituted aryl groups.

The first repeating units of the first polysiloxanes may be based on first precursors selected from divinyldialkoxysilanes and substituted and unsubstituted vinyldialkoxysilanes, and the first repeating units of the second polysiloxanes may be based on first precursors selected from monosubstituted and unsubstituted dialkoxysilanes, wherein the substituted vinyldialkoxysilanes and the monosubstituted dialkoxysilanes each independently may comprise substituents selected from substituted and unsubstituted alkyl groups and substituted and unsubstituted aryl groups.

Thus, two different polysiloxanes are used to produce the polysiloxane resin, the first polysiloxanes comprises Si—vinyl groups and the second polysiloxanes comprises Si—H groups.

The second precursor of the first and second polysiloxane may in particular be a precursor described above. In particular, the second precursor may be one of the precursors described with structural formulae (1) to (6). In particular, the second precursor may be PHM or PUP. As a third precursor of the first and second polysiloxane, for example, MM, PM or PP may be selected. For example, VP may be selected as the first precursor of the first polysiloxane and HM may be selected as the second precursor of the second polysiloxane.

The first and second polysiloxanes may be mixed in a ratio selected of 2:1 to 1:2. In particular, the first and second polysiloxanes are mixed in a ratio of 1:1.

Curing may be carried out by a catalyst. Thus, in the method of producing the polysiloxane resin, a catalyst is added after the first and second polysiloxane have been mixed, which initiates or accelerates the curing, i.e., the crosslinking between the polysiloxanes. In particular, the curing takes place without a solvent.

A hydrosilylation catalyst may be used as the catalyst. A Pt catalyst may be used, i.e., a catalyst comprising Pt. In particular, the Pt catalyst may be selected from an Ossko catalyst, Karstedt catalyst, Speier catalyst, Lamoreaux catalyst, and Ashby catalyst. For example, an Ossko catalyst may have the structural formula:

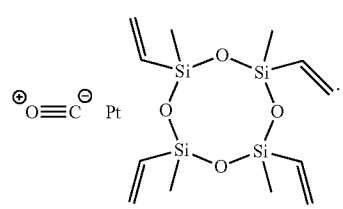

Curing may take place at a temperature of 80° C. to 200° C. In particular, curing occurs at least two different temperatures. A first temperature may be 80° C. to 120° C., and a second temperature may be 120° C. to 200° C. Preferably, curing takes place first at 100° C., then at 150° C.

Curing may be performed for a time of 1 hour to 12 hours, for example, 7 hours. If curing is performed at at least two different temperatures, for example, the first temperature is maintained for a time of 30 minutes to 2 hours, in particular 1 hour, and the second temperature is maintained for a time of 3 hours to 10 hours, in particular 6 hours.

We further provide an optoelectronic component configured to emit UV and/or visible radiation. The optoelectronic component may in particular be a light-emitting diode (LED). The optoelectronic component may comprise at least one component comprising a polysiloxane resin. The polysiloxane resin may be a polysiloxane resin described herein. All properties and features of the polysiloxane resin described herein thus also apply to the optoelectronic component and vice versa.

The polysiloxane resin may comprise linked together first and second polysiloxanes, wherein the first and second polysiloxanes each comprise first, second and third repeating units linked together in any order, wherein the second repeating units are based on second precursors selected from dialkoxysilanes comprising a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each comprising two substituents independently selected from substituted and unsubstituted alkyl groups and substituted and unsubstituted aryl groups. Further, the first repeating units of the first polysiloxanes may be based on first precursors selected from divinyldialkoxysilanes and substituted and unsubstituted vinyldialkoxysilanes, and the first repeating units of the second polysiloxanes may be based on first precursors selected from monosubstituted and unsubstituted dialkoxysilanes, wherein the substituted vinyldialkoxysilanes and the monosubstituted dialkoxysilanes each independently may comprise substituents selected from substituted and unsubstituted alkyl groups and substituted and unsubstituted aryl groups.

Such a component has an increased service life and improved efficiency. These properties are due in particular to the fact that the polysiloxane resin used therein exhibits high transmission, especially in visible light, with a simultaneously adapted refractive index to adjacent materials, as well as high thermal stability.

The optoelectronic component may comprise a semiconductor chip arranged to emit visible and/or UV radiation. For example, the semiconductor chip may be a GaN chip. Further, the semiconductor chip may be disposed in the cavity of a package. A conversion layer may optionally be disposed on the semiconductor chip.

The component may be an encapsulation. The encapsulation may include or comprise the polysiloxane resin. Further, the encapsulation may at least partially surround the semiconductor chip. If a conversion layer is disposed on the semiconductor chip, the encapsulation may at least partially surround the semiconductor chip and the conversion layer. Alternatively, the encapsulation may be arranged spaced apart from the semiconductor chip.

The encapsulation may further comprise dye and/or phosphor particles embedded in the polysiloxane resin. Thus, the encapsulation itself can act as a conversion layer and an additional conversion layer can be dispensed with.

As the encapsulation contains the polysiloxane resin described herein, the component can have an increased service life because the polysiloxane resin has reduced permeability to oxygen and water.

Due to the adjustable refractive index of the polysiloxane resin, the refractive index of the encapsulation material can be adjusted to the refractive index of the semiconductor chip. Thus, total reflection of photons at the interface between the semiconductor chip and the encapsulation can be avoided or reduced, thereby increasing the efficiency of the component.

Further advantages, configurations and developments of the precursor, the polysiloxane, the polysiloxane resin, the method of producing a polysiloxane, the method of producing a polysiloxane resin and the optoelectronic component result from the following examples shown in conjunction with the figures.

Elements that are identical, similar or have the same effect are given the same reference signs in the figures. The figures and the proportions of the elements shown in the figures are not to be regarded as true to scale. Rather, individual elements, in particular layer thicknesses, may be shown exaggeratedly large for better representability and/or understanding.

FIG. 1 shows an optoelectronic component 10. The optoelectronic component is suitable and configured for the emission of radiation, in particular visible light and/or UV radiation. For this purpose, a semiconductor chip 20, for example, a GaN chip, is arranged in the recess of a housing 40. Optionally, a conversion layer may be present on the semiconductor chip 20 (not explicitly shown). The semiconductor chip 20 and optionally the conversion layer are surrounded by an encapsulation 30, which is also arranged in the recess of the package 40. The encapsulation 30 is formed of a polysiloxane resin. A dye or a phosphor may optionally be embedded in the polysiloxane resin in particle form. This optoelectronic component may be, for example, an LED.

The optoelectronic component 10 shown in FIG. 1 is purely exemplary. Other structures and arrangements of the individual elements are also possible. For example, the encapsulation 30 may not be arranged in the recess of the package 40, but merely on the package 40, spaced from the semiconductor chip 20. Further, the encapsulation 30 may simultaneously serve as a conversion layer if, for example, phosphor particles are embedded therein.

The polysiloxane resin of the encapsulation 30 and the corresponding precursor materials are explained in more detail in the following by examples.

The polysiloxane resin is produced from first and second polysiloxanes, which in turn are prepared from first, second and third precursors. The synthesis of polysiloxanes from first precursors selected from VP and HM, second precursors selected from PHM and PUP, and third precursors selected from MM, PM, and PP is explained in the following. These examples are exemplary. All of the above stated alternative materials are equally suitable for producing the polysiloxanes.

While the first and third precursors VP, HM, MM, PM and PP can be purchased, the second precursors PHM and PUP are synthesized first.

The following materials are used for the synthesis and partially the characterization of the samples: Diphenylsilanediol (97%), dimethyldimethoxysilane (97%), phenyltrimethoxysilane (97%), methyltrimethoxysilane (97%), 9-bromophenanthrene (98%), and tetra-n-butylammonium hydroxide (40% aqueous solution) are purchased from Alfa Aesar (Germany). Tert-butyldimethylchlorosilane (98%) is purchased from TCI America. 9-Bromophenanthrene (98%) and vinylphenyldiethoxysilane (97%) are acquired from Fluorochem Ltd (UK). Methylphenyldimethoxysilane (97%), methyldiethoxysilane (97%) and Pt-carbonylcyclovinylmethylsiloxane complex (Ossko catalyst) are acquired from ABCR (Germany). A xylene blend (97%) is purchased from VWR International. Concentrated hydrochloric acid, magnesium chips, and all solvents except dry tetrahydrofuran (THF) are purchased from the central chemical store at Saarland University. THF (97%) has been purchased from Fisher Scientific and purified using a MB-SPS-800 solvent purification system from M. Braun (Germany). Triethylamine was dried over calcium hydride and distilled before use.

The following techniques were used to characterize the samples: Fourier-transform infrared (FT-IR) measurements are performed in ambient air in the weak total reflectance mode (ATR, 40 scans at a resolution of 4 $cm^{-1}$) using a Bruker Vertex 70 spectrometer (Bruker Optics, Germany). Thermogravimetric analyses (TGA) are performed with a Netzsch TG 209C Iris (Netzsch Group, Germany) with 10 K/min heating rate and 40 ml/min nitrogen for the inert measurements and 20 ml/min oxygen and 20 ml/min nitrogen for the oxidizing measurements. Samples are measured up to 1000° C., and an oxidizing atmosphere was used for both methods from 900° C. to 1000° C. Elemental analyses are performed using a Leco 900 CHN analyzer. Differential scanning calorimetry (DSC) is recorded on a Netzsch DSC 204 FI Phoenix (Netzsch Group, Germany) with 10 K/min heating rate and cooling rate from −60° C. to 150° C. using liquid and gaseous nitrogen for cooling and 60 ml/min nitrogen as inert gas. Refractive indices (RI) are measured at 622 nm using an Abbe Refractometer (A .KRÜSS Optronic GmbH, Germany) at 20° C. and monobromonaphthalene as contact liquid for solid samples. UV/Vis spectra are recorded using a Lambda 750 (Perkin Elmer, USA) and a 100 mm integrating sphere, with a glass plate with polysiloxane resin applied to it placed in front of the integrating sphere. For the transmission experiment, the sphere is closed, while for the diffusion experiment, which is used to calculate turbidity values, the primary light trap is open. White and yellow indices are calculated using PerkinElmer UV Winlab (6.4.0.973) software. NMR measurements are recorded using either a Bruker Avance III HD 300 MHz or a Bruker Avance III HD 400 MHz with chloroform-d as solvent and reference. Solid state CP/MAS NMR spectra are recorded using a Bruker Avance III HD with an Ascend 400 WB (400 MHz) core with a zirconia 4 mm rotor at 13 kHz rotation speed. Gel permeation chromatography (GPC) measurements are made using a Viscotek VE1121 pump, with two PSS SDV $10^3$ and $10^5$ columns. Three detectors are used, a Shodex RID org udc 2 (RI), a UV Waters 2487 (UV/Vis) and a PSS SLD 7000/BI-MwA (light scattering). Measurements are performed in THF, calibrated with polystryrene standards using WinGPC 7 software. Plasma etching is performed with a plasma surface technology Femto (Diener electronic GmbH+Co. KG, Germany) with 15 ml/min oxygen and 100% power for 15 minutes. Single crystal X-ray scattering is performed with a Bruker AXS X8 Apex CCD diffractometer using graphite monochromatic Mo Kα radiation.

The synthesis of the second precursors PHM and PUP is performed as follows.

PHM

In a first flask, to 2.00 g (82.29 mmol) of magnesium chips in 40 ml of dry THF, a solution of 20.00 g (77.78 mmol) of 9-bromophenanthrene in 100 ml of dry THF is added slowly at room temperature and stirred under reflux for 1 hour to give a Grignard suspension. In a second flask, 52.97 g (388.9 mmol) of methyltrimethoxysilane is mixed in 50 ml of dry THF. The Grignard suspension of the first flask is transferred to a dropping funnel of the second flask using a transfer cannula. The suspension is slowly added to the mixture. After stirring the mixture at room temperature overnight, it is heated under reflux for 1 hour. The cooled suspension is filtered through a glass filter and the solvent is evaporated. The residue is suspended in 200 ml of toluene and filtered again. After removing the solvent and the remaining methyltrimethoxysilane, the crude product is distilled under vacuum ($8 \times 10^{-3}$ mbar, 152° C.). As yield 11.61 g (53%) of colorless liquid is obtained. The structure can be confirmed by NMR measurements:

$^1$H NMR (300.13 MHz, CDCl$_3$, δ): 8.84 (d, J=7.6 Hz, 1H), 8.78 (d, J=7.9 Hz, 1H), 8.57 (d, J=7.9 Hz, 1H), 8.43 (s, 1H), 8.08 (d, J=7.6 Hz, 1H), 7.79 (m, 4H), 3.82 (s, 6H), 0.73 (s, 3H); $^{13}$C NMR (75.47 MHz, CDCl$_3$, δ): 137.75, 134.57, 131.55, 131.04, 130.66, 130.11, 129.27, 128.65, 127.73, 126.90, 126.68, 126.37, 123.17, 122.53, 50.62, −3.59; $^{29}$Si NMR (59.63 MHz, CDCl$_3$, δ): −13.12; anal., calc. for C$_{17}$H$_{18}$O$_2$Si: C 72.32, H 6.45, N 0.00; found: C 72.30, H 6.42, N 0.00.

PHP

In a first flask, to 2.00 g (82.29 mmol) of magnesium chips in 40 ml of dry THF, a solution of 20.00 g (77.78 mmol) of 9-bromophenanthrene in 100 ml of dry THF is added slowly at room temperature and stirred under reflux for 1 hour to give a Grignard suspension. In a second flask, 30.85 g (155.56 mmol) of phenyltrimethoxysilane is mixed in 50 ml of dry THF. The Grignard suspension of the first flask is transferred to a dropping funnel of the second flask and slowly dropped into the flask. After stirring the mixture at room temperature overnight, it is heated under reflux for 1 hour. The cooled suspension is filtered through a glass filter and the solvent is evaporated. The residue is suspended in 200 ml of toluene and filtered again. After removal of the solvent under reduced pressure, the unreacted components are distilled under vacuum ($5 \times 10^{-2}$ mbar, 25° C.). The remaining crude product is recrystallized in hexane. The yield obtained is 20.31 g (76%) of white or slightly yellow crystals. The structure can be confirmed by NMR:

$^1$H NMR (300.13 MHz, CDCl$_3$, δ): 8.72 (tr, J=7.6 Hz, 2H), 8.38 (s, 1H), 8.30 (d, J=8.1 Hz, 1H), 7.97 (d, J=7.7 Hz, 1H), 7.72 (m, 3H), 7.63 (tr, J=7.7 Hz, 2H), 7.53 (tr, J=7.5 Hz, 1H), 7.40 (m, 3H), 3.71 (s, 6H); $^{13}$C NMR (75.47 MHz, CDCl$_3$, δ): 139.09, 134.84, 134.76, 133.03, 131.81, 131.10, 130.52, 130.15, 129.50, 129.16, 128.94, 128.14, 127.95, 126.93, 126.76, 126.42, 123.08, 122.63, 51.15; $^{29}$Si NMR (59.63 MHz, CDCl$_3$, δ): −27.69; anal. calc. for C$_{22}$H$_{20}$O$_2$Si: C 76.73, H 5.90, N 0.00; found: C 76.71, H 5.85, N 0.00.

The highly aromatic dialkoxysilanes 9-phenanthrenylphenyldimethoxisilane (PUP) and 9-phenanthrenylmethyldimethoxisilane (PHM) are thus prepared in high yields by a Grignard reaction between 9-bromophenanthrene and the corresponding alkoxysilanes. The reaction can be represented as follows:

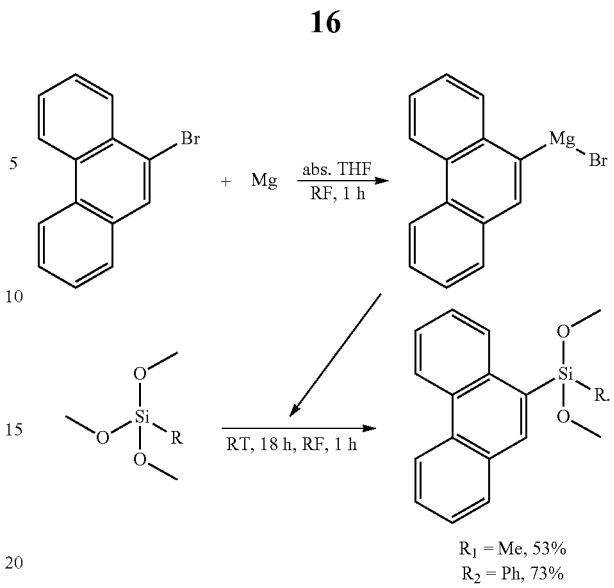

R$_1$ = Me, 53%
R$_2$ = Ph, 73%

R in the general structural formula can thus be methyl Me (for the preparation of PHM, R=R$_1$ with 53% yield) or phenyl Ph (for the preparation of PUP, R=R$_2$ with 76% yield). PUP immediately forms a crystalline product, while PHM is a colorless liquid that takes several months to crystallize. $^1$H NMR spectra show the desired signals for phenanthrenyl (9.0 to 7.5 ppm) and methoxy groups (4.0 to 3.5 ppm) for both PHP and PHM. In addition, PHP shows five additional protons in the aromatic region, while PHM shows only one signal in the methylsilane region (1.0 to −0.5 ppm). $^{13}$C NMR shows all theoretical signals in the expected regions. $^{29}$Si NMR is applied to find out if reactants or by-products are present, but this can be excluded.

The refractive indices RI of all monomers, i.e., precursors, that can be used for the synthesis of polysiloxanes, are determined by IR in transmission mode and are shown in Table 1 (the RI of PUP cannot be determined because PHP is solid).

TABLE 1

| Precursor | RI |
|---|---|
| First precursors | |
| Methyldiethoxysilane (HM) | 1.3746 |
| Vinylphenyldiethoxysilane (VP) | 1.4795 |
| Third precursors | |
| Dimethyldimethoxysilane (MM) | 1.3707 |
| Methylphenyldimethoxysilane (PM) | 1.4795 |
| Diphenyldimethoxysilane (for the solid diphenylsilanediol used, PP). | 1.5440 |
| Second precursors | |
| 9-Phenanthrenylmethyldimethoxysilanes (PHM) 9-Phenanthrenylphenhyldimethoxysilanes (PHP) | 1.6310 |

The refractive indices are determined at 20° C. It can be seen that the first precursors have relatively low refractive indices of 1.3746 and 1.4795 compared to the second precursors. Therefore, the amount of the first precursors in the polysiloxane is kept low if a polysiloxane with a high refractive index is to be obtained.

The third precursors differ in their content of methyl and phenyl groups, which causes the refractive index to increase from 1.3707 through 1.4795 to 1.5440. The polymerized diphenyl component is diphenylsilanediol while diphenyldimethoxysilane is used for the refractive index comparisons because it is a liquid at room temperature. When a methyl group is replaced by a phenyl group, the refractive index increases by 0.1088, while a second substitution increases the refractive index by only 0.0645. The non-linear increase is due to the dimethoxy groups.

For the second precursors, only the refractive index of PHM can be determined. This is justified by the fact that PUP is a solid even at higher temperatures of about 80° C. The refractive index of 1.631 is higher than those of the other precursors, indicating that a high proportion of second precursors is useful in the production of the polysiloxane to produce a polysiloxane with a high refractive index. High proportion in this context means, for example, 40%. It is expected that the refractive index of the solid PUP is even higher.

The crystal structures of the second precursors PHM and PUP are determined by X-ray diffraction. The corresponding results are shown in Table 2.

TABLE 2

| Space group | PHM<br>P2$_1$/c (14) monoclinic | PHP<br>Pbca (61) orthorhombic |
| --- | --- | --- |
| a | 10.1825(18) Å | 10.1311(3) Å |
| b | 7.4659(13) Å | 15.3134(5) Å |
| c | 20.056(4) Å | 23.9366(7) Å |
|   | 90° | 90° |
|   | 100.688(9)° | 90° |
|   | 90° | 90° |
| V | 1498.3(5) Å$^3$ | 3713.6(2) Å$^3$ |

The typical bond angles and distances of the crystal structures are summarized in Table 3.

TABLE 3

|   | PHM | PHP |
| --- | --- | --- |
| Angle |   |   |
| Cl(PH)—Si—C15(Me/Ph) | 111.705(2)° | 113.37(5)° |
| C1(PH)—Si—O1 | 107.904(3)° | 113.67(5)° |
| Cl(PH)—Si—O2 | 109.330(3)° | 102.72(5)° |
| C15(Me/Ph)—Si—O1 | 112.200(3)° | 103.94(5)° |
| C15(Me/Ph)—Si—O2 | 109.676(3)° | 112.49(5)° |
| O1—Si—O2 | 105.824(3)° | 110.93(6)° |
| Torsion angle between phenanthrenyl and Me/Ph plane |   | 87.282(32)° |
| Distance |   |   |
| Si—Cl(PH) | 186.75(1) pm | 186.52 (11) pm |
| Si—C15(Me/Ph) | 184.96(1) pm | 185.57(12) pm |
| Si—O1 | 163.80(1) pm | 162.81(10) pm |
| Si—O2 | 164.33(1) pm | 163.11(10) pm |

"Me" is methyl group, "Ph" is phenyl group and "PH" is phenanthrenyl group.

For the synthesis of a polysiloxane from first precursors (VP, HM), second precursors (PHM, PHP) and third precursors (MM, PM, PP), according to an example, the following procedure may be followed:

To one equivalent of first precursor, two equivalents of second precursor and two equivalents of third precursor, 13 equivalents of distilled water and eight equivalents of methanol are added. Depending on which first precursor is used, either concentrated hydrochloric acid (0.8 equivalents for HM as the first precursor) or tetra-n-butylammonium hydroxide (0.06 equivalents for VP as the first precursor) is added. The flask is equipped with a distillation bridge to collect methanol and water. The suspension is stirred at 85° C. for 1 hour, then at 115° C. for about 1 hour. When no more solvent is distilled, the distillation equipment is removed and the solution is stirred at 115° C. for an additional hour. While the solution is cooling, 250 equivalents of toluene and 150 equivalents of water are added. After mixing the emulsion, the water phase is removed. For HM as the first precursor, this method is repeated with a concentrated solution of potassium bicarbonate and four times with water. For VP as the first precursor, the method is repeated twice with 2 M hydrochloric acid and three times with water. The organic phase is filtered with a 45 μm filter syringe and the solvent is removed first under reduced pressure and then under high vacuum for 4 hours.

The synthesized polysiloxanes are named after their precursors from which they are prepared. The first polysiloxanes are composed of the abbreviations VP, PHM or PUP and MM or PM or PP. In addition, the percentage within the polysiloxane is indicated after each abbreviation. Accordingly, second polysiloxanes are indicated by HM, PHM or PUP and MM or PM or PP. In the polysiloxane resins, the VP or HM is replaced by CC to designate the CH$_2$—CH$_2$ bridge formed by the crosslinking. Such a group designated CC in the polysiloxane resin then has the structural formula:

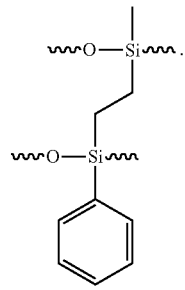

The polysiloxanes are thus prepared by a hydrolysis and condensation reaction of alkoxides or diol monomers.

The production according to one example of first and second polysiloxanes and their crosslinking to a polysiloxane resin is schematically shown below:

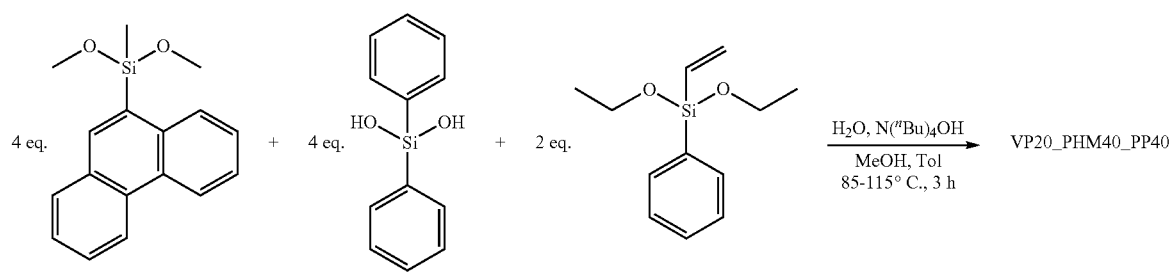

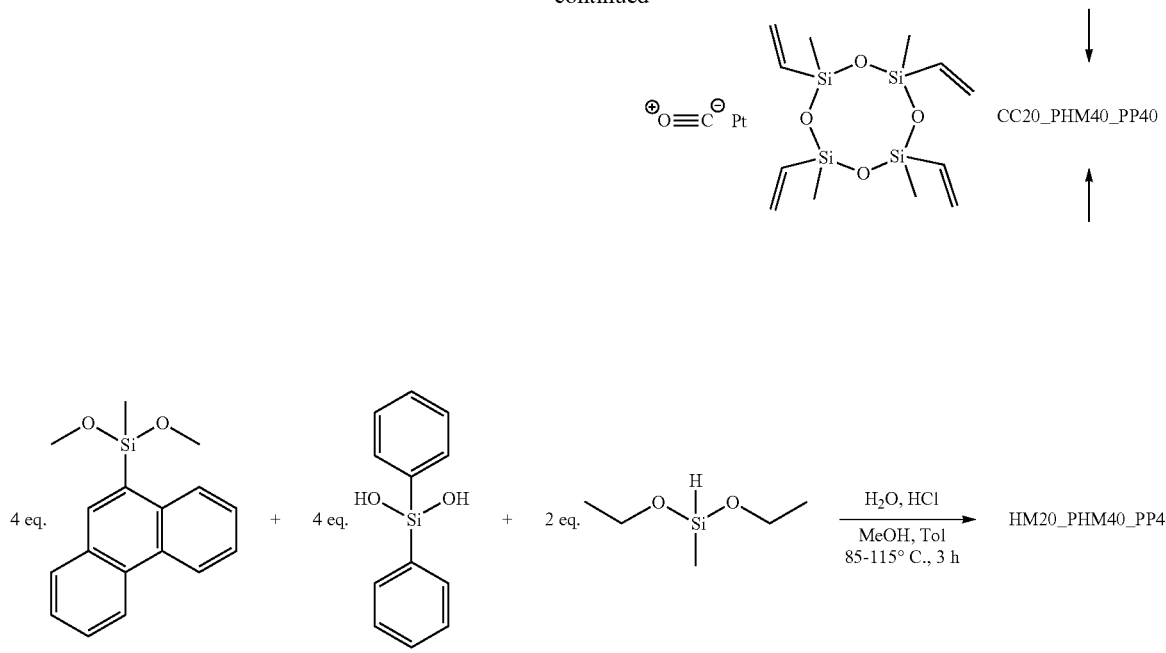

CC20_PHM40_PP40

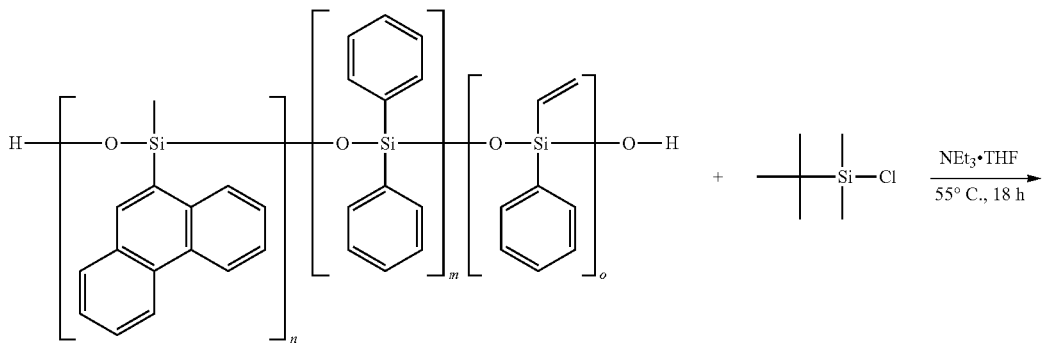

HM20_PHM40_PP40.

The first row shows the reaction of PHM, PP and VP to form a first polysiloxane VP20_PHM40_PP40, and the second row shows the reaction of PHM, PP and HM to form a second polysiloxane HM20_PHM40_PP40. By a polycondensation of the first and second polysiloxane and a hydrosilylation reaction using an Ossko catalyst, the crosslinking to the polysiloxane resin CC20_PHM40_PP40 takes place.

Generally, a first precursor is selected from VP and HM, which is responsible for formation of cross-linking bonds between the polysiloxanes via platinum-catalyzed hydrosilylation to the polysiloxane resins. From PHM and PUP, a second precursor is selected which is highly aromatic with its phenanthrenyl and methyl or phenyl group and causes the increase of RI in the polysiloxane or polysiloxane resin. A third precursor is selected from MM, PM and PP, which can reduce the viscosity of the polysiloxanes and thus produce easily processable polysiloxanes and crack-free polysiloxane films.

To produce the polysiloxanes, a first precursor, a second precursor and a third precursor are selected and mixed with 2.6 equivalents of water and 1.6 equivalents of methanol per silicon atom. Depending on the composition of the precursors, the catalyst for polymerization is selected. For HM as the first precursor HCl is selected, for VP as the first precursor tetra-n-butylammonium hydroxide is selected. Hydride groups in HM need to be acid catalyzed because they react with the hydroxide under basic conditions. Both catalysts can be used to polymerize the vinyl-containing polysiloxane (VP as first precursor).

To terminate the end groups of the polysiloxane, for example, for analytical purposes, about 50 mg of the polysiloxane is poured into a Schlenk flask, aspirated under high vacuum and flooded twice with argon to create an inert atmosphere. 1.5 ml of absolute THF, 40 mg (0.26 mmol) of tert-butyldimethylchlorosilane and 100 µl of absolute triethylamine are added. After stirring the solution for 18 hours at 55° C., the solvent is aspirated under high vacuum for 6 hours. Such a reaction is shown using the example VP20_PHM40_PP40 in the following reaction scheme:

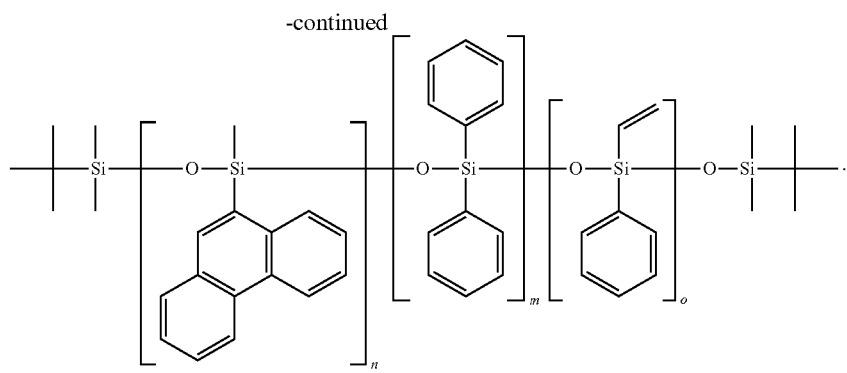

After purifying and drying the first and second polysiloxanes, polysiloxanes are selected to produce a polysiloxane resin. In particular, first and second polysiloxanes containing the same second and third precursors are selected. First and second polysiloxanes are mixed, particularly at the same concentration. Thus, the ratio of hydride-containing polysiloxanes (first polysiloxanes) to vinyl-containing polysiloxanes (second polysiloxanes) is 1:1. According to one example, 330 mg of the first polysiloxane and the corresponding second polysiloxane are mixed with 6 ppm of a Pt catalyst, in particular an Ossko catalyst. To obtain such low concentrations, the two percent Ossko catalyst in xylene is further dissolved in xylene. The mixed first and second polysiloxanes are aspirated at 2 mbar for 1 hour and given a designated substrate such as a Teflon mold or a glass substrate such as a microslice, for example, doctor bladed. If a glass platelet is used, it is cleaned with isopropanol and acetone and then plasma etched for 15 minutes. Finally, the obtained films are cured at 100° C. for 1 hour and at 150° C. for 6 hours to obtain complete crosslinking. An optional second temperature step at 80 to 100° C. for 1 hour can reduce or prevent bubble formation during curing. The films obtained are colorless and highly transparent.

The characterization of the first and second polysiloxanes and polysiloxane resins produced therefrom is described in the following with reference to examples.

The polysiloxanes are characterized by NMR measurements, with all NMR measurements performed in chloroform-d and the $^1$H-NMR spectra shown with respect to the toluene $CH_3$ signal. Small amounts of solvent remain in the polysiloxanes even after the purification method. As an example, FIG. 2 shows the $_1$H, $^{13}$C and $^{29}$Si NMR spectra of HM20_PHM40_MM40. The $^{29}$Si NMR spectrum shows a low signal to noise ratio since only 200 mg of sample was used. Shown in each example is the chemical shift CS in ppm.

The $^1$H NMR spectrum shows the signals of methyl (1.0 to −0.5 ppm), hydride (5.3 to 4.5 ppm) and phenanthrenyl (8.8 to 7.0 ppm) groups. In $^{13}$C NMR, both regions of methyl (2.0 to 1.0 ppm) and phenanthrenyl (138.0 to 122.5 ppm) are visible. In $^{29}$Si NMR, four regions of D signals, the signals from −17.4 to −18.4 ppm can be assigned to methylsilane and the signals from −19.6 to −21.4 ppm to dimethylsilane. From −31.3 to −33.2 ppm, signals can be identified for phenanthrenylmethylsilane in the center of the polymer chain, while signals from −35.5 to −37.0 ppm belong to phenanthrenylmethylsilane near the end of the polymer chain, indicating the slower reactivity of phenathrenylmethylsilane compared to methylsilane or dimethylsilane. For the other polysiloxanes, the $^{29}$Si signals of the phenylmethyl groups are at −33.0 ppm, the vinylphenyl and diphenyl groups are at −42 to −46 ppm, and the signal of phenanthrenylphenyl is at −45 to −50 ppm.

Figure 3:
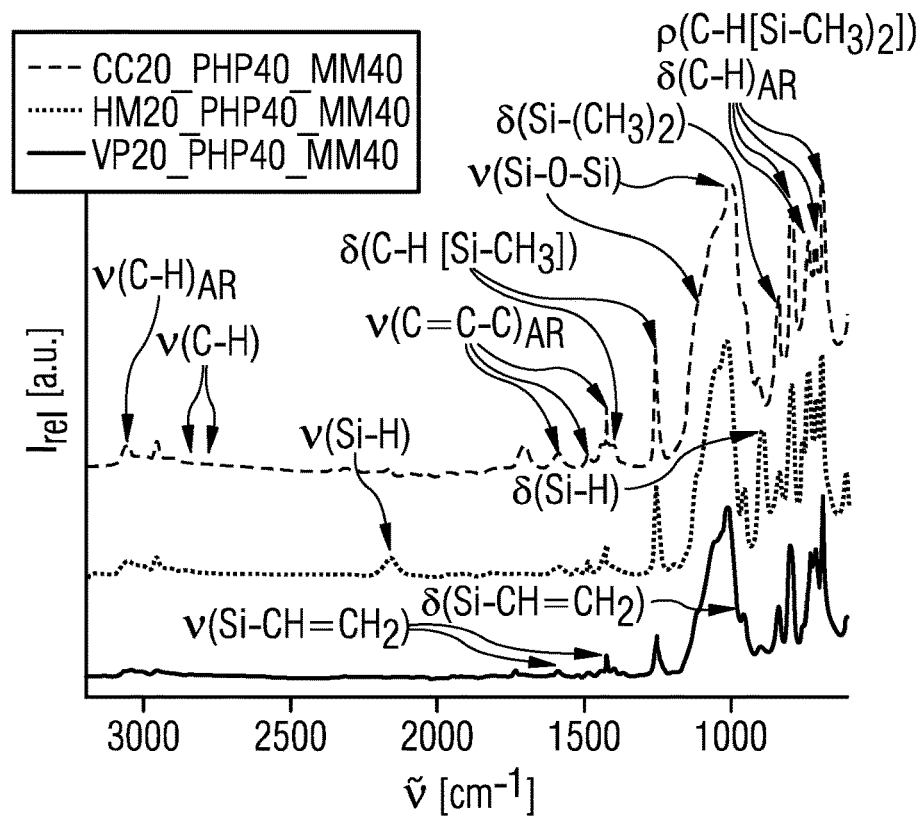
FIG. 3 shows FT-IR spectra of examples of polysiloxanes and a polysiloxane resin.

FT-IR spectra were also recorded from the first and second polysiloxanes and from the cured polysiloxane resins according to examples. FIG. 3 shows three exemplary spectra of the examples CC20_PHP40_MM40 (polysiloxane resin), HM20_PHP40_MM40 (second polysiloxane) and VP20_PHP40_MM40 (first polysiloxane). Each is plotted in the relative intensity $I_{rel}$ in arbitrary units a.u. as a function of wave number $\tilde{v}$ in $cm^{-1}$. Characteristic IR signals of the polysiloxanes are at 1120 and 1020 $cm^{-1}$ for the Si—O backbone. The methyl side groups show vibrations at 2960, 2912, 1404, 1259 and 796 $cm^{-1}$ for the C—H bond and at 843 $cm^{-1}$ for the Si—$(CH_3)_2$ bond. The aryl groups show signals at 3049, 3072, 742, 721 and 696 $cm^{-1}$ for the C—H bond and at 1592, 1489 and 1429 $cm^{-1}$ for the C=C—C bond. The vinyl group of VP20_PHP40_MM40 polysiloxane is visible at 1655 $cm^{-1}$. The hydride group of HM20_PHP40_MM40 has strong bands at 896 and at 2129 $cm^{-1}$.

The molecular weights of the first and second polysiloxanes can be estimated by $^1$H NMR spectroscopy and GPC. For the $^1$H-NMR measurement, the polysiloxanes are provided with an end group as described above, which can be easily detected in the spectrum.

Table 4 shows the molecular weights (MW) and polydispersity indices (PDI) of the first and second polysiloxanes according to examples.

TABLE 4

| Second polysiloxanes | MW [g/mol] NMR | MW [g/mol] GPC | PDI GPC | First polysiloxanes | MW [g/mol] NMR | MW [g/mol] GPC | PDI GPC |
|---|---|---|---|---|---|---|---|
| HM20_PHM40_MM40 | 27200 | 21900 | 3.12 | VP20_PHM40_MM40 | 2200 | 2500 | 1.24 |
| HM20_PHM40_PM40 | 8300 | 6300 | 1.74 | VP20_PHM40_PM40 | 35200 | 8900 | 2.76 |
| HM20_PHM40_PP40 | 15200 | 1200 | 1.26 | VP20_PHM40_PP40 | 18800 | 8300 | 2.38 |
| HM20_PHP40_MM40 | 6200 | 11800 | 3.05 | VP20_PHP40_MM40 | 27100 | 12100 | 2.68 |

TABLE 4-continued

| Second polysiloxanes | MW [g/mol] NMR | MW [g/mol] GPC | PDI GPC | First polysiloxanes | MW [g/mol] NMR | MW [g/mol] GPC | PDI GPC |
|---|---|---|---|---|---|---|---|
| HM20_PHP40_PM40 | 9100 | 3100 | 1.44 | VP20_PHP40_PM40 | 8800 | 800 | 1.09 |
| HM20_PHP40_PP40 | 10100 | 11900 | 3.67 | VP20_PHP40_PP40 | 12800 | 1100 | 1.20 |
| HM40_PHM20_PP40 | 9500 | 3400 | 1.43 | VP40_PHM20_PP40 | 13900 | 2700 | 1.38 |
| HM40_PHM40_PP20 | 40700 | 4900 | 1.50 | VP40_PHM40_PP20 | 27300 | 3000 | 1.47 |

The first column lists the hydride-containing second polysiloxanes, and the fifth column lists the vinyl-containing first polysiloxanes. The molecular weights of the first polysiloxanes are higher or equal to those of the second polysiloxanes except for the example HM20_PHM40_MM40 and HM40_PHM40_PP20, which should also have lower values. The GPC values range from 800 to 22000 g/mol. Almost all values obtained by GPC are significantly lower than those estimated by NMR. Possible problems in NMR estimation could be unreacted and small molecules leading to higher values than those measured by GPC. These small molecules cannot be measured by GPC because they form an eluate with the solvent.

The trend of the PDI values follows the length of the polysiloxane chains, i.e., higher molecular weights cause an increase of the PDI. Comparison of GPC analysis of example HM20_PHM_40_XX40, where XX stands for MM, PM and PP, shows a strong decrease in molecular weight and PDI with increasing size of the third precursor, which may be related to increased activation energy due to steric hindrance.

The refractive indices of the polysiloxanes are measured in transmission mode and vary between 1.52 and 1.63, as shown in Table 5.

TABLE 5

| Second polysiloxane | RI | First polysiloxane | RI |
|---|---|---|---|
| HM20_PHM40_MM40 | 1.593 | VP20_PHM40_MM40 | 1.521 |
| HM20_PHM40_PM40 | 1.612 | VP20_PHM40_PM40 | 1.569 |
| HM20_PHM40_PP40 | 1.627 | VP20_PHM40_PP40 | 1.578 |
| HM20_PHP40_MM40 | 1.602 | VP20_PHP40_MM40 | 1.573 |
| HM20_PHP40_PM40 | 1.618 | VP20_PHP40_PM40 | 1.633 |
| HM20_PHP40_PP40 | 1.603 | VP20_PHP40_PP40 | 1.630 |
| HM40_PHM20_PP40 | 1.599 | VP40_PHM20_PP40 | 1.596 |
| HM40_PHM40_PP20 | 1.616 | VP40_PHM40_PP20 | 1.576 |

For the PHM-containing polysiloxanes, the values are lower than those of PHM alone, but higher than for all first precursors and third precursors. For PUP, a similar value is expected as for the PHP-containing polysiloxanes. All values except those for PUP with PM or PP are higher for the HM-containing polysiloxanes. Since the refractive index depends on both molar refraction and molar volume, the size of the side groups is of high importance. The sterically smaller HM can lead to a denser network than the sterically more demanding VP. This leads to a higher influence of the phenanthrenyl groups.

Thermogravimetric analyses (TGA) for first and second polysiloxanes according to examples are carried out in oxygen and in nitrogen atmosphere at 900 to 1000° C. The two different measurement conditions help to distinguish the difference between depolymerization of the polysiloxanes (inert atmosphere) and pyrolytic decomposition (oxidative atmosphere) of the organic groups in TGA analysis. In inert gas measurements, the atmosphere is changed to an oxygen atmosphere above 900° C. to pyrolytically decompose graphite obtained from the organic groups and reduce the silicon residues to $SiO_2$. To compare the start of decomposition, $T_{95}\%$ values are used, which is the temperature at which 5% mass loss occurred. Values for different first and second polysiloxanes are shown in Table 6.

TABLE 6

| Second polysiloxanes | $T_{95\%}O_2$ [C. °] | $T_{95\%}N_2$ [C. °] | First polysiloxanes | $T_{95\%}O_2$ [C. °] | $T_{95\%}N_2$ [C. °] |
|---|---|---|---|---|---|
| HM20_PHM40_MM40 | 234 | 248 | VP20_PHM40_MM40 | 190 | 193 |
| HM20_PHM40_PM40 | 254 | 228 | VP20_PHM40_PM40 | 202 | 207 |
| HM20_PHM40_PP40 | 246 | 247 | VP20_PHM40_PP40 | 198 | 191 |
| HM20_PHP40_MM40 | 221 | 237 | VP20_PHP40_MM40 | 213 | 202 |
| HM20_PHP40_PM40 | 210 | 211 | VP20_PHP40_PM40 | 254 | 244 |
| HM20_PHP40_PP40 | 184 | 184 | VP20_PHP40_PP40 | 193 | 177 |
| HM40_PHM20_PP40 | 269 | 282 | VP40_PHM20_PP40 | 218 | 220 |
| HM40_PHM40_PP20 | 218 | 224 | VP40_PHM40_PP20 | 202 | 202 |

Figure 4:
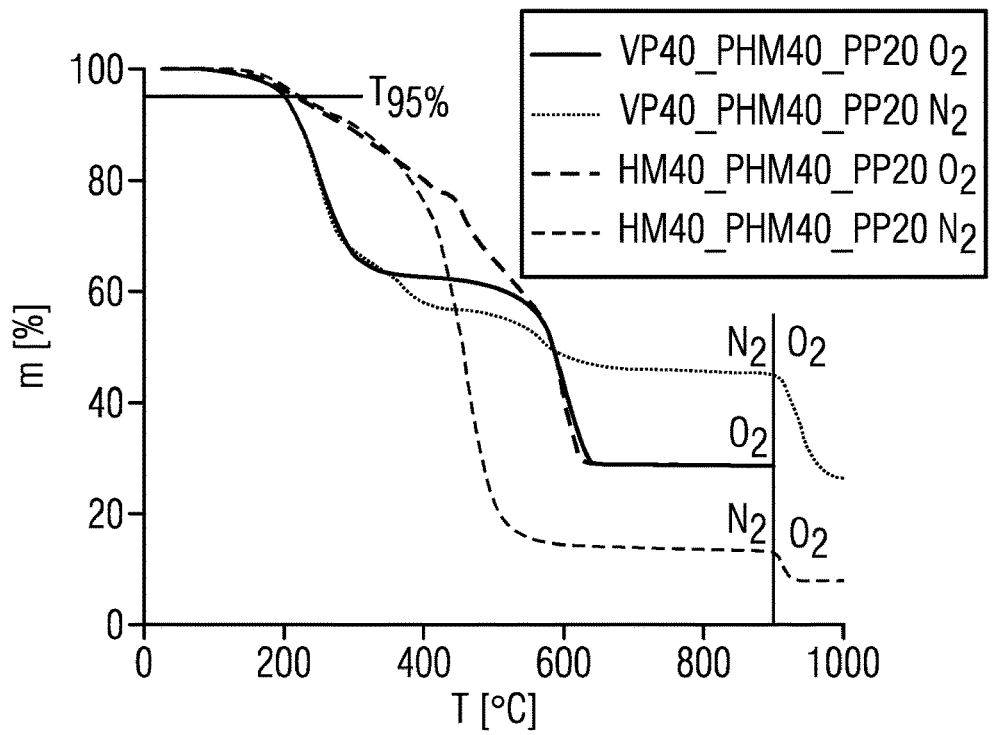
FIG. 4 shows thermogravimetric measurements of examples of polysiloxanes.

FIG. 4 shows the TGA curves for the examples HM40_PHM40_PP20 and VP40_PHM40_PP20. The mass m in % is plotted against the temperature T in ° C. $T_{95\%}$ typically ranges from 160 to 250° C., second polysiloxanes (HM . . . ) with PHM or PUP and MM have higher decomposition temperatures than the corresponding first polysiloxanes (VP . . . ). This could be due to the better miscibility of the chemically more similar side groups between the methyl groups during synthesis, resulting in a higher molecular weight.

DSC measurements are further performed between −60° C. and 150° C. in two cycles. FIGS. 5A to D show DSC curves of the first heating cycle (FIGS. 5A and C) and the second heating cycle (FIGS. 5B and D) for examples of second polysiloxanes (FIGS. 5A and B) and examples of first polysiloxanes (FIGS. 5C and D). Each is plotted in the DSC offset $O_{DSC}$ in mW/mg as a function of temperature T in ° C. Using the first heating cycle, the melting temperature $T_m$ of the crystalline regions within the polysiloxane is determined. The second heating cycle is used to determine the glass transition temperature $T_g$ and additional melting temperatures that could not be determined in the first heating cycle. $T_g$ is an indicator of the size of the side groups and their degrees of freedom, wherein larger groups such as phenyl increase the value and smaller groups such as hydride or more flexible groups such as propyl decrease it.

Table 7 shows $T_m$ and $T_g$ of examples of first and second polysiloxanes, moreover the melting temperatures that occur in the second heating cycle ($T_m2$ and $T_m3$). For the example VP20_PHP40_NM40, a second glass transition temperature is observed, which gives an indication of the existence of a block polymer with a high methyl side group-containing region and a $T_g$ of −22.3° C. and a high phenyl side group-containing region with a $T_g$ of 41.6° C.

TABLE 7

| | 1. Cycle | | | | 2. Cycle | | | |
|---|---|---|---|---|---|---|---|---|
| | $T_m1$ | Area [J/g] | $T_g1$ | $T_g2$ | $T_m2$ | Area [J/g] | $T_m3$ | Area [J/g] |
| HM20_PHM40_MM40 | 47.07 | 3.30 | 17.19 | | | | | |
| HM20_PHM40_PM40 | | | 2.10 | | | | | |
| HM20_PHM40_PP40 | | | 6.98 | | | | | |
| HM20_PHP40_MM40 | | | 3.31 | | | | | |
| HM20_PHP40_PM40 | 81.39 | 0.04 | 6.75 | | 12.54 | 0.39 | | |
| HM20_PHP40_PP40 | 83.68 | 24.49 | 4.24 | | 58.80 | 3.71 | 82.21 | 12.89 |
| HM40_PHM20_PP40 | | | −6.55 | | | | | |
| HM40_PHM40_PP20 | | | 3.50 | | | | | |
| VP20_PHM40_MM40 | 92.96 | 37.73 | 42.30 | | 90.02 | 31.56 | | |
| VP20_PHM40_PM40 | 91.46 | 30.32 | 18.35 | | 86.65 | 26.04 | | |
| VP20_PHM40_PP40 | 91.98 | 30.22 | 5.83 | | 89.61 | 28.99 | | |
| VP20_PHP40_MM40 | 85.89 | 27.52 | 22.30 | 41.57 | 59.84 | 1.31 | 84.71 | 14.92 |
| VP20_PHP40_PM40 | 67.98 | 0.82 | 14.14 | | | | | |
| VP20_PHP40_PP40 | 70.35 | 11.92 | −4.39 | | 54.07 | 0.40 | 62.88 | 1.04 |
| VP40_PHM20_PP40 | 83.38 | 7.51 | 18.23 | | −13.78 | 0.40 | | |
| VP40_PHM40_PP20 | 87.29 | 31.33 | 17.21 | | 83.35 | 27.72 | | |

Overall, the $T_g$ of the second polysiloxanes increases with increasing phenyl content from −17° C. to 7° C., while the $T_g$ of the first polysiloxanes ranges from −42° C. to 42° C. The only exception is VP20_PHP40_PP40 with a low $T_g$ of −4.4° C. The first polysiloxanes show larger melting ranges (labeled "Area" in Table 7) than the second polysiloxanes because they have an additional phenyl group, while the second polysiloxanes have an additional methyl group that increases the $T_g$ values due to a lower content of degrees of freedom of the sterically large phenyl group. Among the polysiloxanes containing PHM and PP, the highly aromatic examples (20% VP/HM) show the highest values, 7° C. and 5.8° C., respectively, while the sterically less demanding ones (diphenyl compared to phenanthrenylmethyl, 20% PHM) comprise the lowest values, −6.6° C. and −18.3° C.

Figure 6:
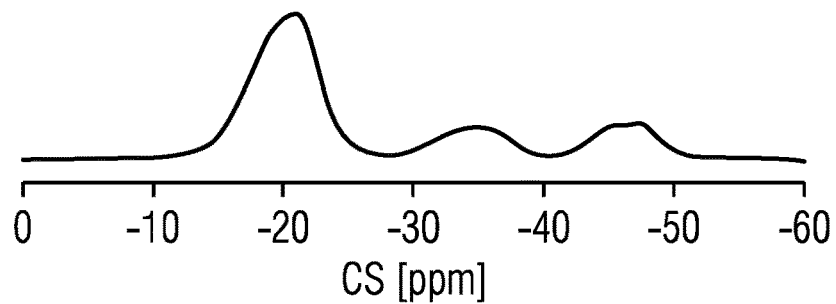
FIG. 6 shows a $^{29}$Si—CP MAS NMR spectrum of an example of a polysiloxane resin.

FIG. 6 shows a $^{29}$Si solid state CP-MAS NMR of the example CC20_PHP40_MM40. The signal at −20 ppm can be assigned to the dimethyl silicon atom as well as the MeSi(OR)$_2$—CH$_2$—CH$_2$—X silicon atom, which can be confirmed using $^1$H, $^{29}$Si HMBC measurements of the polysiloxane HM20_PHP40_MM40. The peak at −35 ppm is generated by the PhSi(OR)$_2$—CH$_2$—CH$_2$—X atom, which can also be confirmed by measurements of the polysiloxane VP20_PHP40_MM40. The signal at −47 ppm can be assigned to the silicon atom of the phenanthrenyl-phenyl-containing silicon atom, which can be associated with a diphenyl silicon atom.

An example of an FT-IR spectrum of a polysiloxane resin is already shown in FIG. 3. In the spectrum, signals for Si—H and Si vinyl groups can still be detected, which means that no complete conversion, i.e., crosslinking, was obtained during the hydrosilylation method. However, a solid non-sticky film is obtained. Complete conversion cannot be achieved due to increasing viscosity and reduced mobility during the curing process.

Figure 7:
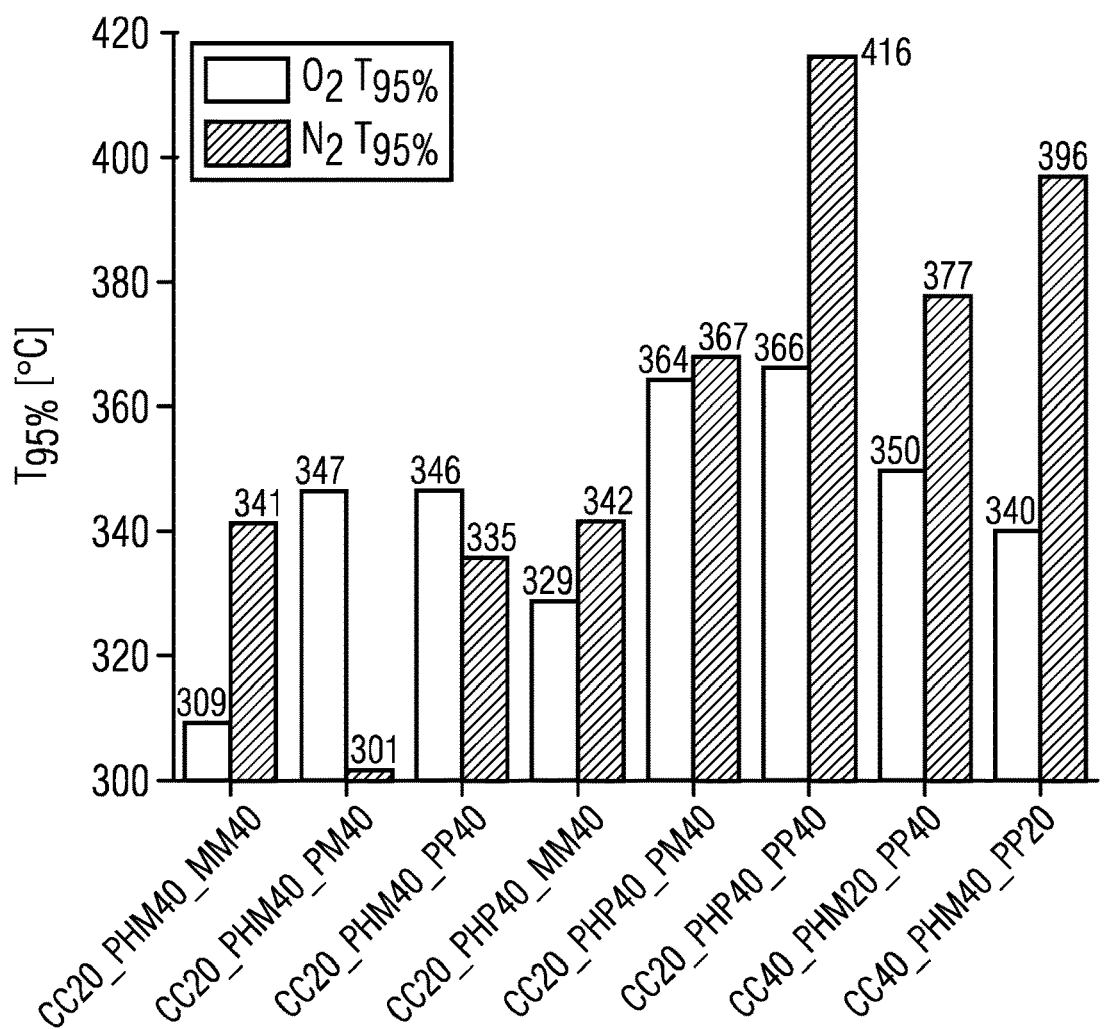
FIG. 7 shows $T_{95\%}$ values of examples of polysiloxane resins.

TGA measurements are also carried out on the polysiloxane resins to determine the thermal stability. FIG. 7 shows a comparison of the onset temperatures $T_{95\%}$ in ° C. for different examples of polysiloxane resins. Almost all polysiloxane resins show a higher decomposition temperature under nitrogen than under oxygen. The decomposition temperatures of the polysiloxane resins under oxygen change from 300 to 370° C. with increasing content of aromatic side groups. In nitrogen, the values vary from 300° C. for the high-methyl polysiloxanes to 420° C. for the highly aromatic and phenanthrenyl-rich polysiloxanes.

Besides the variation of precursors, different proportions of precursors for the polysiloxane resins CCXX_PHMXX_PPXX are also investigated. The first precursors (VP, HM), the second precursor (PHM) and the third precursor (PP) are mixed in different proportions to obtain three polysiloxane resins with a content of 20% of first, second or third precursor or first, second and third repeating unit. The two remaining precursors are used at 40% silicon content. The polysiloxane resins show little difference in their decomposition temperature in oxygen atmosphere (336° C. to 350° C.) and increasing stability for higher crosslinked polysiloxane resins under nitrogen atmosphere. At a low aromatic side group content of less than 70% (30% to 70%), thermal stability is independent of the aromatic side group content with a $T_{95\%}$ of 300 to 350° C. A higher aromatic content increases the thermal stability to 360° C. to 416° C.

Figure 8:
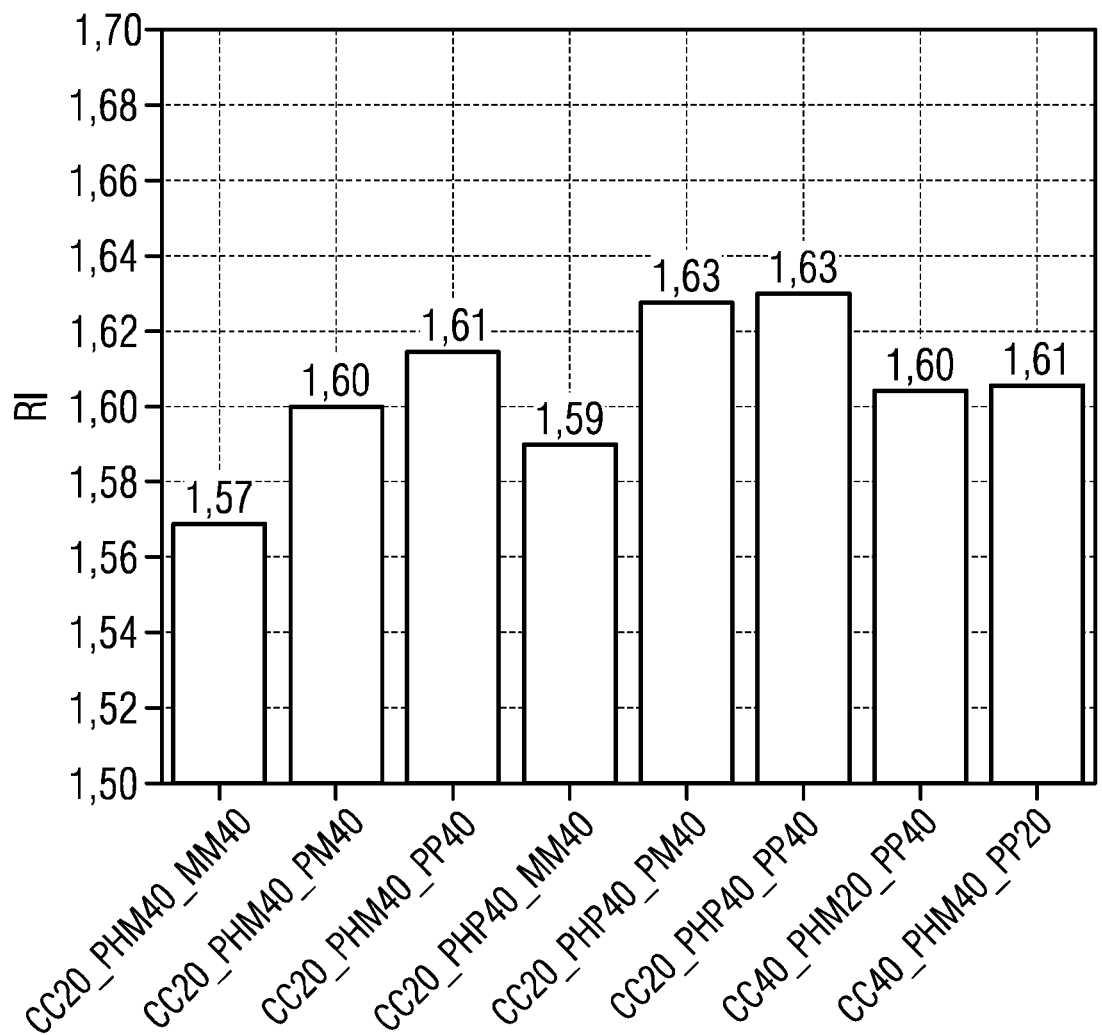
FIG. 8 shows refractive indices RI of polysiloxane resins according to examples.

The refractive index of the polysiloxane resins is measured in reflection mode with a contact fluid (1-bromonaphthalene). FIG. 8 shows that the refractive index RI varies from 1.57 to 1.63 for the polysiloxane resins, in particular the RI increases with increasing phenyl content from 1.57 to 1.63. Polysiloxane resins with different precursor contents have the highest RI with the lowest content of crosslinking first precursors (VP/HM), while replacing PHM with PP shows little influence. As the phenyl content increases from CC20_PHM40_MM40 (0 Ph)<CC20_PHM40_PM40 (1 Ph)=CC20_PHP40_MM40 (1 Ph)<CC20_PHP40_PM40 (2 Ph)=CC20_PHM40_PP40 (2 Ph)<CC20_PHP40_PP40 (3 Ph), the RI increases from 1.57 to 1.63.

The polysiloxane resins are deposited on microscope slides and examined with an integrating sphere using a UV/VIS spectrometer. The transmittance Tr and haze H at 450 nm as well as the yellow and white indices YI and WI of the polysiloxane resins are shown in Table 8.

TABLE 8

|  | Tr [%] | H [%] | YI | WI |
|---|---|---|---|---|
| CC20_PHM40_MM40 | 98.98 | 8.66 | 0.83 | 97.01 |
| CC20_PHM40_PM40 | 98.86 | 7.79 | 0.60 | 97.51 |
| CC20_PHM40_PP40 | 97.75 | 9.08 | 0.81 | 97.06 |
| CC20_PHP40_MM40 | 97.96 | 7.96 | 1.14 | 97.01 |
| CC20_PHP40_PM40 | 96.74 | 15.12 | 0.91 | 96.21 |
| CC20_PHP40_PP40 | 96.18 | 18.77 | 1.67 | 93.58 |
| CC40_PHM20_PP40 | 98.89 | 15.14 | −0.02 | 98.74 |
| CC40_PHM40_PP20 | 98.46 | 8.73 | 0.48 | 97.58 |

Figure 9:
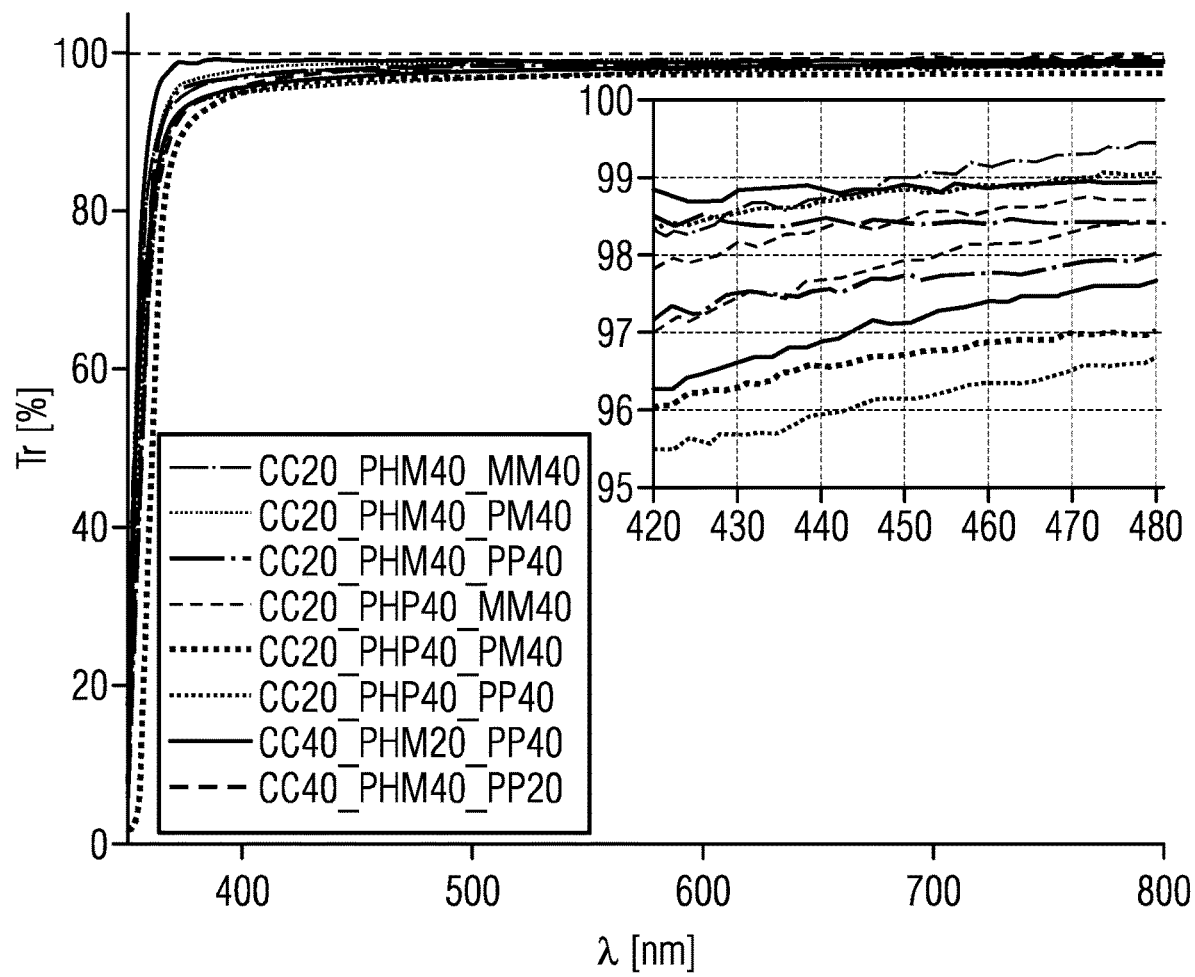
FIG. 9 shows transmission spectra of polysiloxane resins according to examples.

All polysiloxane resins show a transmission Tr of 96 to 99% as shown in FIG. 9. There, the transmission Tr in percent is plotted against the wavelength λ in nm for various examples of polysiloxane resins. The transmission decreases with increasing phenyl content and increasing RI. The example with only one aromatic group next to the phenyl group in the vinyl-containing first precursor (CC20_PHM40_MM40) shows the highest value with 98.98%. When a methyl group is replaced with a phenyl group (CC20_PHM40_PM40 and CC20_PHP40_MM40), the transmittance is reduced to 98.86% and 97.96%, respectively. Further decreasing the aromatic portions leads to a transmission of 96.74% (CC20_PHP40_PM40) and 96.18% (CC20_PHP40_PP40), respectively. The same trend can be observed when the composition of CC20_PHM40_PP40 is varied, the example with the highest aromatic content shows the lowest transmission value (97.75% for a 20% CC example). To calculate the fraction of light that is scattered as it passes through the samples, the turbidity value H is determined.

This value varies from 7.8 to 9.1% at 450 nm for the examples with a low phenyl content, while it increases up to 19% for highly aromatic examples.

The white and yellow indices are calculated using PerkinElmer UV-WinLab software. Spectra from 380 to 780 nm are recorded in 5 nm steps. Yellow indices (YI) greater than 0 indicate a yellowish sample, negative values indicate bluish samples. White index (WI) of 100 is achievable, higher values indicate bluish samples and lower values indicate yellowish samples.

YIs vary from −0.02 to 0.91 for almost all polysiloxane resins, indicating a slightly yellowish color of the films obtained. However, these values are so small that they cannot be measured in thicker samples. The values increase with higher phenyl content.

The WI of about 97 were observed for almost all samples. The value may increase with low content of phenyl and high content of methyl groups in the polysiloxanes. Increasing the phenyl content leads to lower WI, indicating more yellowish films. The best value is obtained for sample CC40_PHM20_PP40 with only 20% phenanthrenyl content.

DSC measurements of the polysiloxane resins are performed between −60° C. to 150° C. in two cycles analogous to the polysiloxanes as described above. The results of the first heating cycle and the second heating cycle are shown in FIGS. 10A and B. Curing generally increases the glass transition temperature. The measurements were performed in the crosslinked polymers, although crosslinking lowers the possibility of crystallization. That is why smaller or no signals are observed. Thus, this method can also be used for indirect measurement of crosslinking. The integrated area increases with increasing crosslinking and a shift of the melting temperatures $T_m$ to lower temperatures can also be observed. The melting temperatures are lower than those in the corresponding polysiloxanes for the first polysiloxanes. This is only partially true for the second polysiloxanes. The results of the DSC measurements are shown in Table 9.

TABLE 9

|  | $T_m$[° C.] | $T_m$Area [J/g] | $T_g$[° C.] |
|---|---|---|---|
| CC20_PHM40_MM40 | — | — | 17.01 |
| CC20_PHM40_PM40 | 59.04 | 3.688 | 49.05 |
| CC20_PHM40_PP40 | 52.54 | 2.597 | 39.25 |
| CC20_PHP40_MM40 | 55.47 | 0.043 | 33.56 |
| CC20_PHP40_PM40 | 61.31 | 3.956 | 51.33 |
| CC20_PHP40_PP40 | 60.65 | 0.401 | 25.34 |
| CC40_PHM20_PP40 | 53.59 | 2.014 | 34.68 |
| CC40_PHM40_PP20 | 53.41 | 1.819 | 43.20 |

The $T_m$ of all polysiloxane resins ranged from 52.54 to 61.31° C., giving a variation of 9° C. depending on the composition. A higher phenyl content leads to higher values, while high concentrations of methyl groups show no $T_m$. The $T_g$ of all polysiloxane resins are significantly higher than their corresponding first and second polysiloxanes.

Variation in the proportion of precursors shows no difference in $T_m$, while $T_g$ increases with increasing proportion of sterically larger groups and lower proportion of degrees of freedom (PP<VP/HM<PHM).

To simulate the thermal aging of polysiloxane resins within an LED, polysiloxane resins are treated under high energy LED operating temperatures (150 to 200° C.) to test their thermal stability. Thermal stability can be verified by decolorizing the samples using UV/VIS measurements. Samples are treated at 180° C. in air for 63 days (FIG. 11 shows the transmission of different polysiloxane resins after their synthesis (bottom) and after thermal treatment (top)). UV/VIS measurements are performed periodically during this investigation, as shown in FIGS. 12A and B. In each example, the transmittance Tr in percent is plotted as a function of time t in days d. The yellow and white indices (YI and WI, respectively) are compared before and after thermal treatment. The phenanthrenylmethyl-containing samples show decreasing transmittance after 63 days with increasing phenyl content (94.4%→91.5%→82.1%). The phenanthrenyl-containing polysiloxanes CC20_PHP40_MM40 and CC20_PHP40_PM40 lose transmission to 82.7% and 66.1%. The highly aromatic samples CC20_PHP40_PP40 obtain a transmission of 87.5%.

Figure 13:
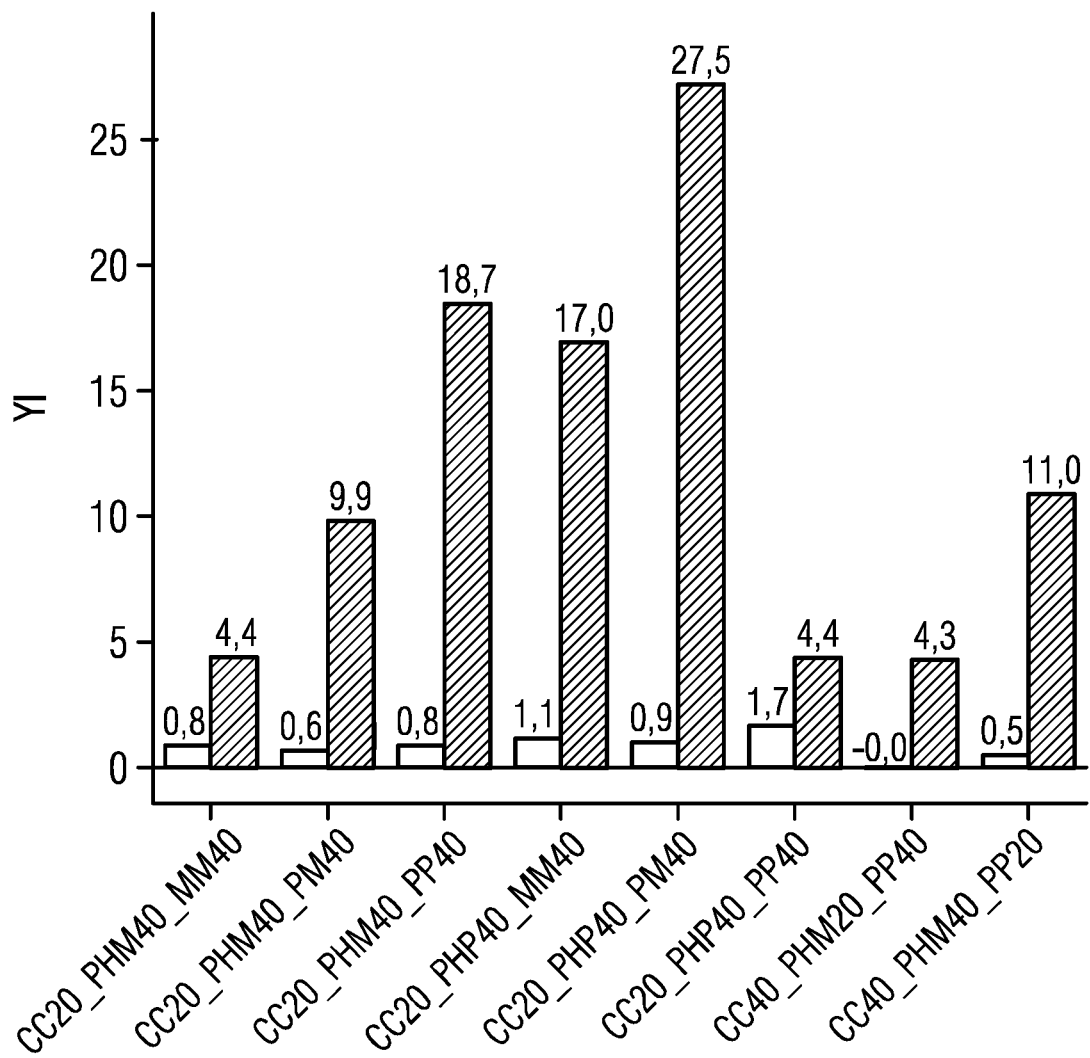
FIG. 13 shows yellow indices of polysiloxane resins according to examples.
Figure 14:
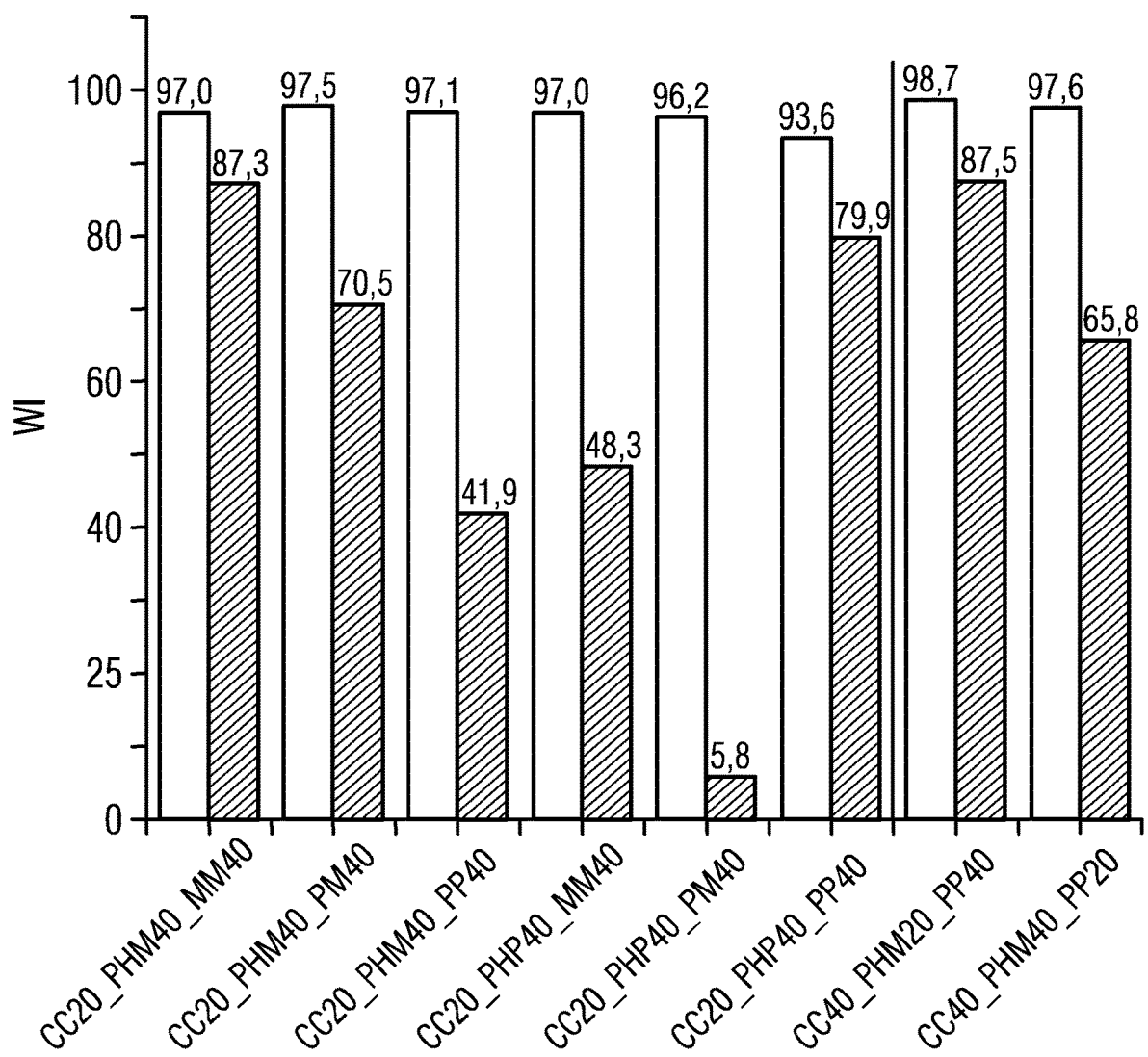
FIG. 14 shows white indices of polysiloxane resins according to examples.

The varied compositions of CC20_PHM40_PP40 show decreasing transmittance after 63 days with increasing phenyl content from 94.2% for 20% PHM to 85.7% for 20% PP down to 82.2% for 20% CC. The yellow and white indices YI and WI imply intense yellowing of the polysiloxanes as shown in FIGS. 13 and 14. In the figures, the YI and WI indices are shown respectively after synthesis (white blocks) and after 63 days at 180° C. (shaded blocks). With increasing phenyl content from CC20_PHM40_MM40 to CC20_PHM40_PP40, the yellowing increases linearly from 0.8 YI for the polysiloxanes to 18.7 YI and from 97 WI to 42 WI.

Phenanthrenylphenyl samples CC20_PHP40_MM40 and CC20_PHP40_PM40 show high yellowing with increasing phenyl content, YI increases from 1.1 (0.9) to 17 and 28 YI respectively, WI shows the same trend and decreases from 97 (96) to 48 and 5.8 WI for CC20_PHP40_PM40, respectively. The sample with the highest phenyl content (CC20_PHP40_PP40) shows little yellowing compared to the high methyl containing CC20_PHM40_MM40. YI increases from 1.7 to 4.4, while WI decreases from 94 to 80. Variation in precursor composition in the CCXX_PHMXX_PPXX polysiloxane resin results in little difference (YI 0.0 to 0.8, WI 97.1 to 98.7) before treatment. Yellowing increases with increasing aromatic content in the CCXX_PHMXX_PPXX samples with 20% PHM<20% PP<20% CC.

Our precursors, polysiloxanes, resins, methods and components are not limited by the description based on the examples. Rather, this disclosure encompasses any new feature as well as any combination of features, which in particular includes any combination of features in the appended claims, even if this feature or combination itself is not explicitly stated in the claims or examples.

This application claims priority of German patent application 102020118247.3, the disclosure of which is incorporated herein by reference.

The invention claimed is:

1. A polysiloxane comprising first, second and third repeating units linked together in any order,
    wherein the first repeating units are based on first precursors selected from divinyldialkoxysilanes, substituted and unsubstituted vinyldialkoxysilanes, and monosubstituted and unsubstituted dialkoxysilanes, wherein the substituted vinyldialkoxysilanes and the monosubstituted dialkoxysilanes each comprise substituents independently of one another, selected from substituted and unsubstituted alkyl groups and substituted and unsubstituted aryl groups,
    the second repeating units are based on second precursors selected from dialkoxysilanes comprising a substituent selected from substituted and unsubstituted alkyl and substituted and unsubstituted aryl groups, and a substituent selected from substituted and unsubstituted polycyclic aromatic hydrocarbon groups,
    and the third repeating units are based on third precursors selected from substituted dialkoxysilanes and substituted disilanols each comprising two substituents independently selected from substituted and unsubstituted alkyl groups and substituted and unsubstituted aryl groups.

2. The polysiloxane according to claim 1, wherein the first precursors are selected from vinylphenyldiethoxysilane and methyldiethoxysilane,
    the second precursors are selected from 9-phenanthrenylmethyldimethoxysilane, 9-phenanthrenylphenyldimethoxysilane, 1-naphthylmethyldimethoxysilane, 2-naphthylmethyldimethoxysilane, 1-naphthylphenyldimethoxysilane and 2-naphthylphenyldimethoxysilane,
    the third precursors are selected from dimethyldimethoxysilane, methyldimethoxyphenylsilane and diphenylsiloxanediol.

3. The polysiloxane according to claim 1, wherein the first, second and third repeating units are present in a ratio of 1:2:2 in the polysiloxane.

4. The polysiloxane according to claim 1, wherein the first precursors comprise vinylphenyldiethoxysilane and the polysiloxane has silicon atoms with vinyl substituents.

5. The polysiloxane according to claim 1, wherein the first precursors comprise methyldiethoxysilane.

6. The polysiloxane according to claim 1, comprising a refractive index adjustable from 1.57 to 1.63.

7. The polysiloxane according to claim 1, comprising an optical transmittance of 450 nm to 800 nm from 95% to 100%.

8. A polysiloxane resin comprising linked together first and second polysiloxanes, wherein the first and second polysiloxanes each comprise first, second and third repeating units linked together in any order, wherein the second repeating units are based on second precursors selected from dialkoxysilanes comprising a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each comprising two substituents independently selected from substituted and unsubstituted alkyl groups and substituted and unsubstituted aryl groups, and
    the first repeating units of the first polysiloxanes are based on first precursors selected from divinyldialkoxysilanes and substituted and unsubstituted vinyldialkoxysilanes, and wherein the first repeating units of the second polysiloxanes are based on first precursors selected from monosubstituted and unsubstituted dialkoxysilanes, wherein the substituted vinyldialkoxysilanes and the monosubstituted dialkoxysilanes each independently comprise substituents selected from substituted and unsubstituted alkyl groups and substituted and unsubstituted aryl groups.

9. The polysiloxane resin according to claim 8, wherein first and second polysiloxanes are present in the polysiloxane resin in a ratio to each other of 2:1 to 1:2.

10. An optoelectronic component configured to emit UV and/or visible radiation comprising at least one component comprising a polysiloxane resin comprising linked together first and second polysiloxanes, wherein the first and second polysiloxanes each comprise first, second and third repeating units linked together in any order, wherein the second repeating units are based on second precursors selected from dialkoxysilanes comprising a substituent selected from substituted and unsubstituted alkyl and substituted and unsubstituted aryl groups, and a substituent selected from substituted and unsubstituted polycyclic aromatic hydrocarbon groups, and the third repeating units are based on third precursors selected from substituted dialkoxysilanes and substituted disilanols each comprising two substituents independently selected from substituted and unsubstituted alkyl groups and substituted and unsubstituted aryl groups,
    wherein the first repeating units of the first polysiloxanes are based on first precursors selected from divinyldialkoxysilanes and substituted and unsubstituted vinyldialkoxysilanes, and wherein the first repeating units of the second polysiloxanes are based on first precursors selected from monosubstituted and unsubstituted dialkoxysilanes, wherein the substituted vinyldialkoxysilanes and the monosubstituted dialkoxysilanes each independently comprise substituents selected from substituted and unsubstituted alkyl groups and substituted and unsubstituted aryl groups.

11. The optoelectronic component according to claim 10, wherein the at least one component comprises an encapsulation.

* * * * *